US012731648B2

(12) United States Patent
Chen et al.

(10) Patent No.: US 12,731,648 B2
(45) Date of Patent: Sep. 8, 2026

(54) NON-VOLATILE MEMORY WITH WORD LINE RAMP SENSING FOR MEMORY CELL TRACKING

(71) Applicant: Sandisk Technologies, Inc., Milpitas, CA (US)

(72) Inventors: Albert Chen, Milpitas, CA (US); Eric Fu, Sunnyvale, CA (US); Jiahui Yuan, Fremont, CA (US); Anirudh Amarnath, San Jose, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/756,481

(22) Filed: Jun. 27, 2024

(65) Prior Publication Data

US 2025/0372178 A1 Dec. 4, 2025

Related U.S. Application Data

(60) Provisional application No. 63/654,706, filed on May 31, 2024.

(51) Int. Cl.

| | |
|---|---|
| ***G11C 16/26*** | (2006.01) |
| ***G11C 16/04*** | (2006.01) |
| ***G11C 16/08*** | (2006.01) |
| ***G11C 16/10*** | (2006.01) |
| ***H10B 43/10*** | (2023.01) |
| *H10B 43/27* | (2023.01) |
| *H10B 43/35* | (2023.01) |

(52) U.S. Cl.
CPC .......... *G11C 16/26* (2013.01); *G11C 16/0483* (2013.01); *G11C 16/08* (2013.01); *G11C 16/10* (2013.01); *H10B 43/10* (2023.02); *H10B 43/27* (2023.02); *H10B 43/35* (2023.02)

(58) Field of Classification Search
CPC ....................................................... G11C 16/26
See application file for complete search history.

(56) References Cited

U.S. PATENT DOCUMENTS

| | | | | |
|---|---|---|---|---|
| 7,372,731 | B2 | 5/2008 | Ban | |
| 7,957,187 | B2 | 6/2011 | Mokhlesi et al. | |
| 8,130,551 | B2 | 3/2012 | Oowada et al. | |
| 9,472,298 | B1 | 10/2016 | Louie et al. | |
| 9,576,673 | B2 | 2/2017 | Jiang et al. | |
| 10,418,097 | B2 | 9/2019 | Avraham et al. | |
| 10,991,444 | B1 | 4/2021 | Bazarsky et al. | |
| 2007/0279996 | A1 * | 12/2007 | Rolandi | G11C 16/3418 365/222 |
| 2023/0186992 | A1 * | 6/2023 | Guo | G11C 16/0483 365/185.21 |
| 2025/0244881 | A1 * | 7/2025 | Amarnath | G06F 3/0659 |

* cited by examiner

*Primary Examiner* — Hoai V Ho
(74) *Attorney, Agent, or Firm* — PEARL COHEN LLP

(57) ABSTRACT

A non-volatile storage apparatus stores data in the non-volatile memory cells by programming the non-volatile memory cells to a set of data states and reads data stored in the non-volatile memory cells by sensing for a set of read reference levels for the data states. To address data retention issues, including memory cells having the threshold voltages drift over time, one or more of the set of read reference levels are shifted based on sensing the non-volatile memory cells for two different conditions during a single ramping up of a voltage signal applied to the non-volatile memory cells.

20 Claims, 26 Drawing Sheets

Storage System 100
Memory Controller 120
130
Memory
160
Memory Interface
158
ECC Engine
156
Processor
154
NOC
164
DRAM Controller
140
volatile memory
152
Host Interface
102
Host Bit Line
414
417
472
474

DL
SGDT0
SGDT1
SGD0
SGD1
DD0
DD1
WL161
WL160
WL159
Wl158
WL157
WL156
WL155
WL154
WL153
WL152
429
WL82
WL81
DU
Joint
DL
WL80
WL6
WL5
WL4
WL3
WL2
WL1
WL0
DS1
DS0
SGS1
SGS0
SGSB1
SGSB0
SL
454
453
z
x
y

472

429
DL
DL
MC1
WL160
WL160
DL
DL
MC2
WL159
WL159
DL
DL
MC3
WL158
WL158
DL
DL
MC4
WL157
WL157
DL
DL
MC5
498
497
WL156
WL156
496
497
498
493
492
491
490
491
492
493 number of cells
S0
S1
S2
S3
S4
S5
S6
S7
S8
S9
S10
S11
S12
S13
S14
S15
Vr1
Vr2
Vr3
Vr4
Vr5
Vr6
Vr7
Vr8
Vr9
Vr10
Vr11
Vr12
Vr13
Vr14
Vr15
$V_T$
number of cells
S0
S1
S2
S3
S4
S5
S6
S7
S8
S9
S10
S11
S12
S13
S14
S15
Vr1'
Vr2'
Vr3'
Vr4'
Vr5'
Vr6'
Vr7'
Vr8'
Vr9'
Vr10'
Vr11'
Vr12'
Vr13'
Vr14'
Vr15'
$V_T$ set magnitude of initial Vpgm and set PC = 1
602
channel pre-charge
604
boost channels
606
apply program pulse
608
program-verify and lock out cells having reached target state
610
count failed cells
616
617
last state?
yes
no
619
adjust states being verified, if necessary
618
failed bits ≤ predetermined limit?
no
620
PC<PL?
yes
yes
624
614
step Vpgm by ΔVpgm and increment PC
626
status = fail
status = pass

Figure 11

| DR READ detect bit number | Shift read DVCGR offset table |
|---|---|
| 0<N=<63 | Default read |
| 63<N=<95 | 1ST table |
| 95<N=<127 | 2ND table |
| 127<N=<223 | 3RD table |
| 223<N | 4TH table |

Figure 13

| Bit 1 | Bit 0 | Shift |
|---|---|---|
| 0 | 0 | -14 DAC |
| 0 | 1 | -10 DAC |
| 1 | 0 | -6 DAC |
| 1 | 1 | -2 DAC |

Figure 12

| Para name | 1ST | | | | 2ND | | | | 3RD | | | | 4TH | | | |
|---|---|---|---|---|---|---|---|---|---|---|---|---|---|---|---|---|
| | Bit | Step | Start | End | Bit | Step | Start | End | Bit | Step | Start | End | Bit | Step | Start | End |
| DVCG_S1R_DR_xxx | 2 | 4 | -2 | 10 | 2 | 4 | -2 | 10 | 2 | 4 | -2 | 10 | 2 | 4 | -2 | 10 |
| DVCG_S2S3R_DR_xxx | 2 | 4 | -4 | 8 | 2 | 4 | -6 | 6 | 2 | 4 | -6 | 6 | 2 | 4 | -8 | 4 |
| DVCG_S4S5R_DR_xxx | 2 | 4 | -6 | 6 | 2 | 4 | -8 | 4 | 2 | 4 | -8 | 4 | 2 | 4 | -10 | 2 |
| DVCG_S6S7R_DR_xxx | 2 | 4 | -8 | 4 | 2 | 4 | -8 | 4 | 2 | 4 | -10 | 2 | 2 | 4 | -12 | 0 |
| DVCG_S8S9R_DR_xxx | 2 | 4 | -8 | 4 | 2 | 4 | -10 | 2 | 2 | 4 | -12 | 0 | 2 | 4 | -14 | -2 |
| DVCG_S10S11R_DR_xxx | 2 | 4 | -10 | 2 | 2 | 4 | -14 | -2 | 2 | 4 | -16 | -4 | 2 | 4 | -18 | -6 |
| DVCG_S12S13R_DR_xxx | 2 | 4 | -10 | 2 | 2 | 4 | -14 | -2 | 2 | 4 | -18 | -6 | 2 | 4 | -22 | -10 |
| DVCG_S14R_DR_xxx | 2 | 4 | -12 | 0 | 2 | 4 | -16 | -4 | 2 | 4 | -20 | -8 | 2 | 4 | -24 | -12 |
| DVCG_S15R_DR_xxx | 2 | 4 | -14 | -2 | 2 | 4 | -20 | -8 | 2 | 4 | -24 | -12 | 2 | 4 | -28 | -16 |

1202

NON-VOLATILE MEMORY WITH WORD LINE RAMP SENSING FOR MEMORY CELL TRACKING

CLAIM TO PRIORITY

The present application claims priority from U.S. Provisional Patent Application No. 63/654,706, entitled "NON-VOLATILE MEMORY WITH WORD LINE RAMP SENSING FOR MEMORY CELL TRACKING", filed May 31, 2024, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory that the non-volatile memory operate reliably (e.g., user be able to successfully read back data stored in the non-volatile memory).

BRIEF DESCRIPTION OF THE DRAWINGS

Like-numbered elements refer to common components in the different figures.

FIG. 11 is a table that correlates bit count to a second table.

FIG. 12 is a table for device parameters indicating shift in read reference voltages.

FIG. 13 is a table indicating shift in read reference voltages.

DETAILED DESCRIPTION

Some non-volatile memory can suffer from data retention issues, including memory cells' threshold voltage drifting over time after programming. The longer data remains in a memory cell, the greater the chance and the greater the degree of memory cells' threshold voltage drifting. If memory cells' threshold voltages drift too much, then the memory system may experience an error when trying to read the data.

To compensate for the above-identified data retention issue, it is proposed to perform on-chip (e.g., on the memory die) tracking of threshold voltages and adjust the reference levels used for reading based on the tracking of threshold voltages. To reduce the impact of tracking threshold voltages on the time needed for reading, the process of tracking threshold voltages is implemented by sensing the non-volatile memory cells for multiple conditions during a single ramping up of a voltage signal applied to the non-volatile memory cells as part of the read process. The results of this sensing is used to determine whether to shift the reference levels used for reading.

Figure 1:
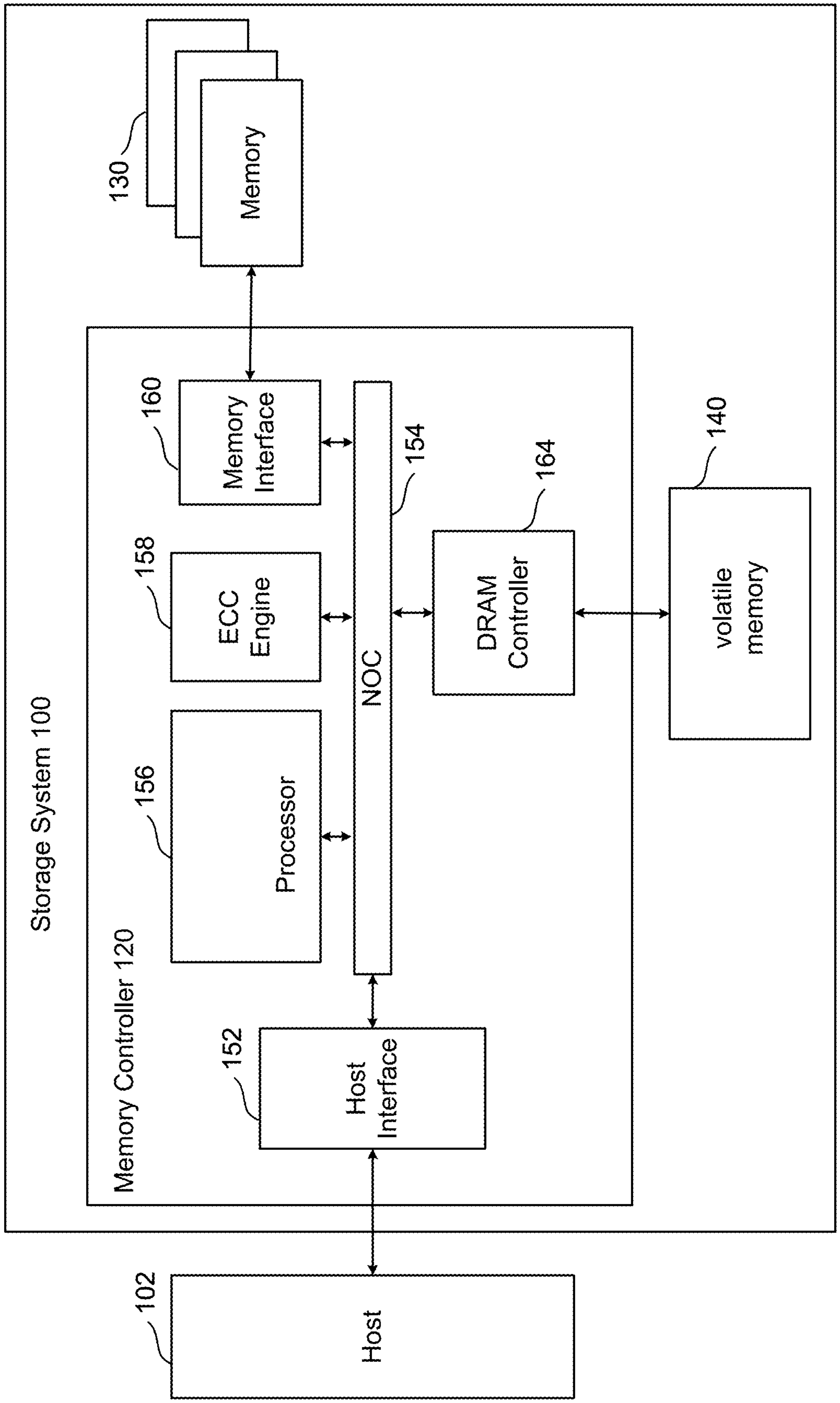
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
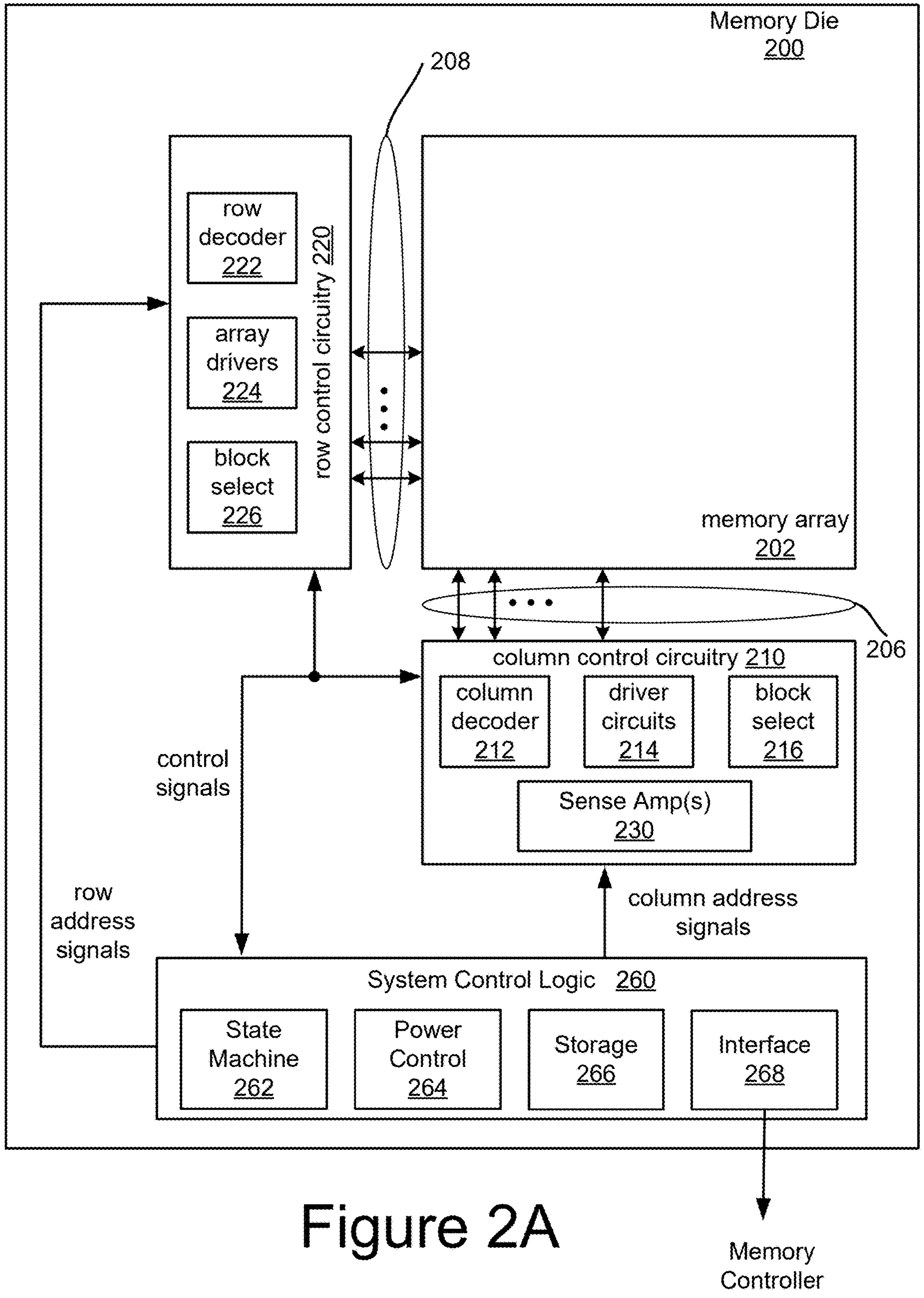
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuits for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
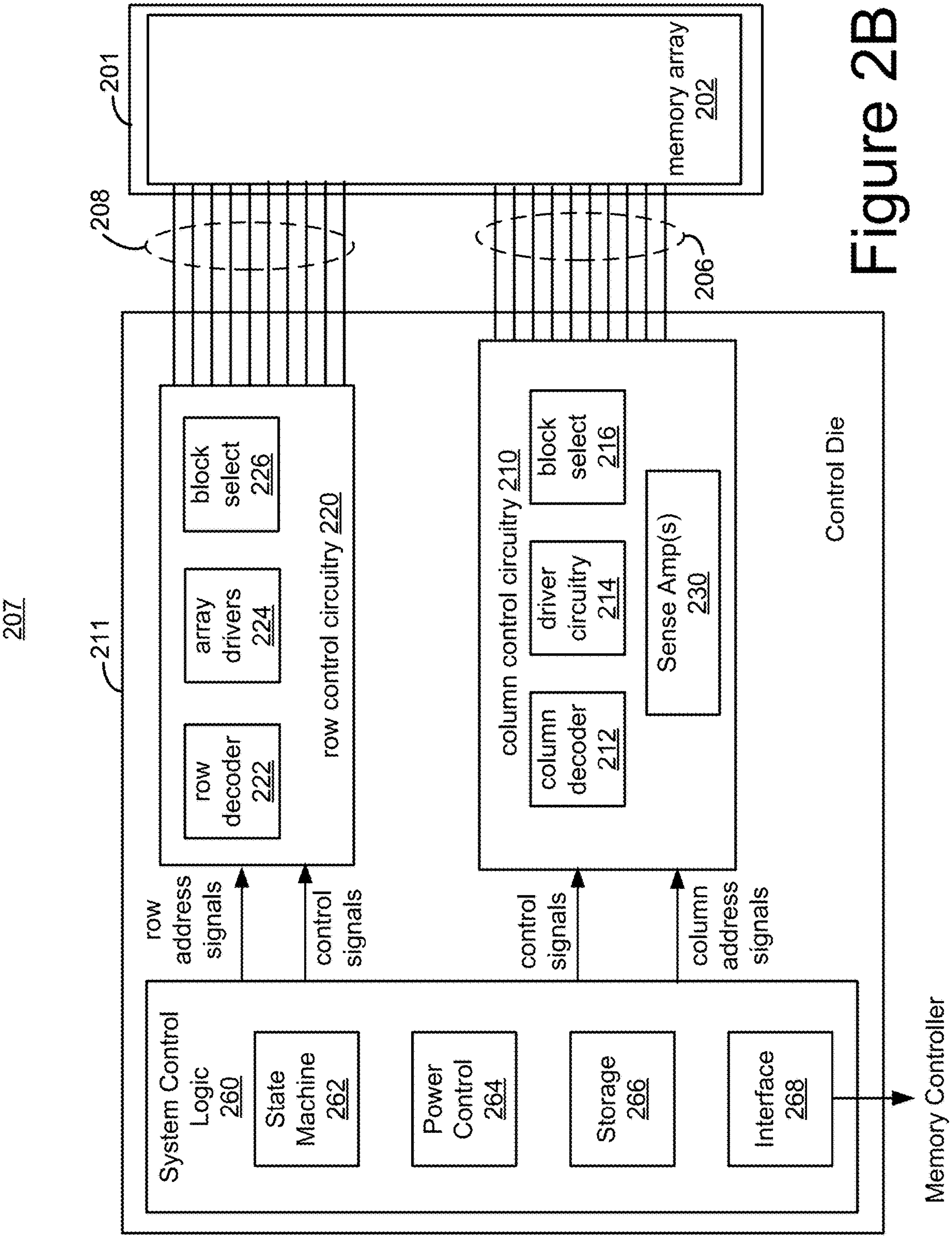
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
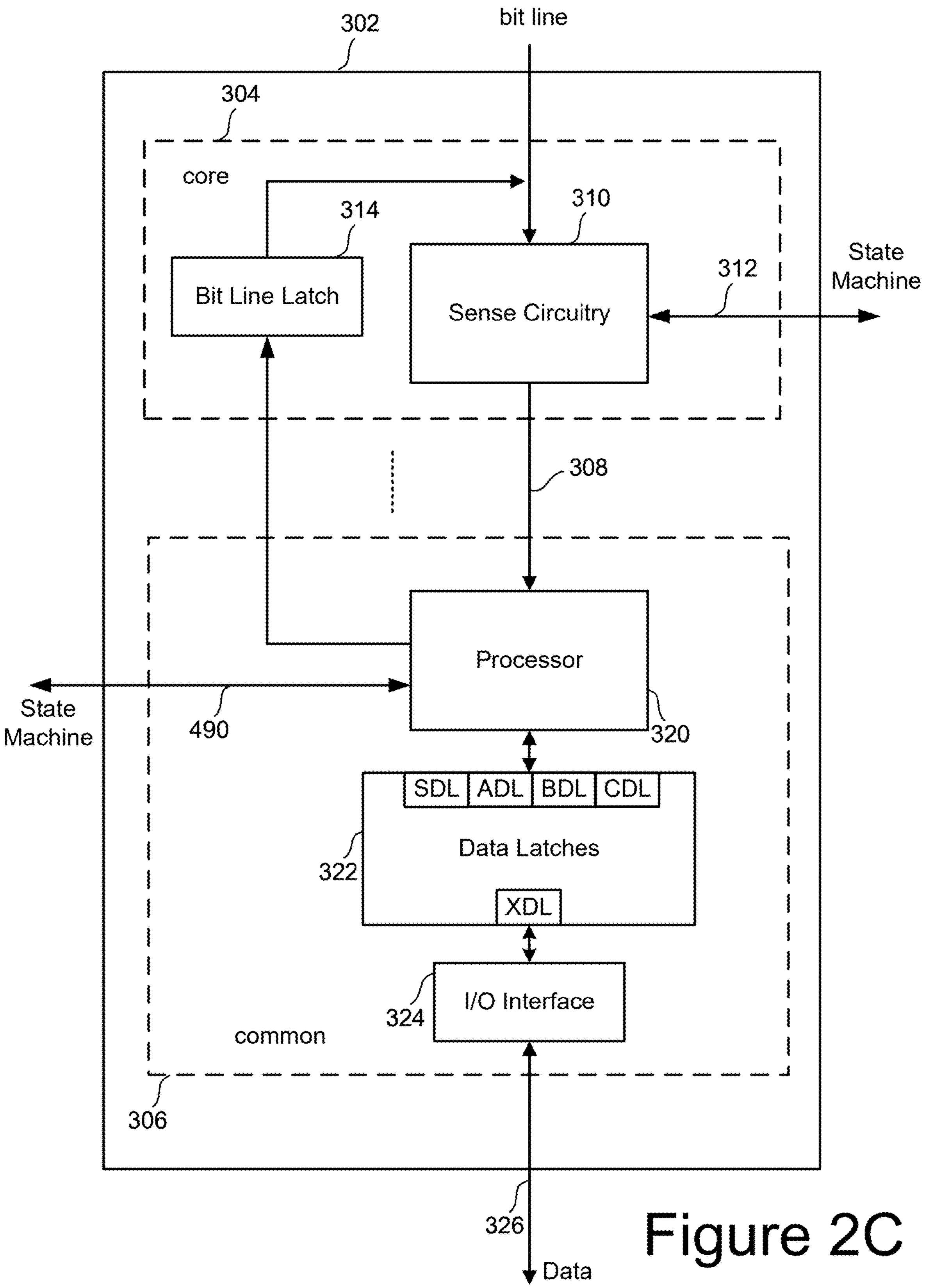
FIG. 2C depicts details of an individual sense block.

FIG. 2C is a block diagram depicting an individual sense block 302 of sense amplifiers 230 partitioned into a core portion 304 (referred to as a sense module 304) and a common portion 306. In one embodiment, there will be a separate sense module 304 for each bit line and one common portion 306 for a set of multiple sense modules 304. In one example, a sense block 302 will include one common portion 306 connected to eight, twelve, or sixteen sense modules 304. Each of the sense modules 304 in a group will communicate with the associated common portion 306 via a data bus 308. In one embodiment, sense amplifiers 230 will include many sense blocks 302.

Sense module 304 comprises sense circuitry 310 that determines whether a conduction current in a connected bit line is above or below a predetermined level or, in voltage based sensing, whether a voltage level in a connected bit line is above or below a predetermined level. The sense circuitry 310 is to receive control signals from the state machine via input lines 312. In some embodiments, sense circuitry 310 includes a circuit commonly referred to as a sense amplifier. Sense module 304 also includes a bit line latch 314 that is used to set a voltage condition on the connected bit line. For example, a predetermined state latched in bit line latch 314 will result in the connected bit line being pulled to a state designating program inhibit (e.g., VDD).

Common portion 306 comprises a processor 320, data latches 322 and an I/O Interface 324 coupled between the set of data latches 322 and data bus 326. Processor 320 performs computations. For example, one of its functions is to determine the data stored in the sensed memory cell and store the determined data in the set of data latches. The set of data latches 322 is used to store data bits determined by processor 320 during a read operation. It is also used to store data bits imported from the data bus 326 during a program operation. The imported data bits represent write data meant to be programmed into the memory. I/O interface 324 provides an interface between data latches 322 and the data bus 326.

During read or sensing, the operation of the system is under the control of state machine 262 that controls (using power control 264) the supply of different control gate or other bias voltages to the addressed memory cell(s). As it steps through the various predefined control gate voltages corresponding to the various memory states supported by the memory, the sense module 304 may trip at one of these voltages and an output will be provided from sense module 304 to processor 320 via bus 308. At that point, processor 320 determines the resultant memory state by consideration of the tripping event(s) of the sense module 304 and the information about the applied control gate voltage from the state machine via signal lines 490. It then computes a binary encoding for the memory state and stores the resultant data bits into data latches 322. In another embodiment, bit line latch 314 serves double duty, both as a latch for latching the output of the sense module 304 and also as a bit line latch as described above.

Data latch stack 322 contains a stack of data latches corresponding to an associated sense module 304. In one embodiment, there are three, four or another number of data latches per sense module 304. In one embodiment, the latches are each one bit (e.g., one bit per sense module 304). In one embodiment, the latches for each sense module 304 will be referred to as SDL, XDL, ADL, BDL, and CDL. Thus, in one embodiment, each sense module 304 has its own set of SDL, XDL, ADL, BDL, and CDL. In the embodiments discussed here, the latch XDL is a transfer latch used to exchange data with the I/O interface 324. In addition to a first sense amplifier data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In a 2-bit per cell embodiment, only ADL and BDL might be used, while a 4-bit per cell embodiment might include a further set of DDL latches. In other embodiments, the XDL latches can be used to hold additional pages of data, such as a 4-bit per cell MLC embodiment that uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per memory cell formats. In embodiments discussed below, the latches ADL, BDL, CDL, SDL and XDL can transfer data between themselves and the bit line latch 314.

In some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 322 from the data bus 326. During the verify process, Processor 320 monitors the verified memory state relative to the desired memory state. When the two are in agreement, processor 320 sets the bit line latch 314 so as to cause the bit line to be pulled to a state designating program inhibit. This inhibits the memory cell coupled to the bit line from further programming even if it is subjected to programming pulses on its control gate. In other embodiments the processor initially loads the bit line latch 314 and the sense circuitry sets it to an inhibit value during the verify process.

In some implementations (but not required), the data latches are implemented as a shift register so that the parallel data stored therein is converted to serial data for data bus 326, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
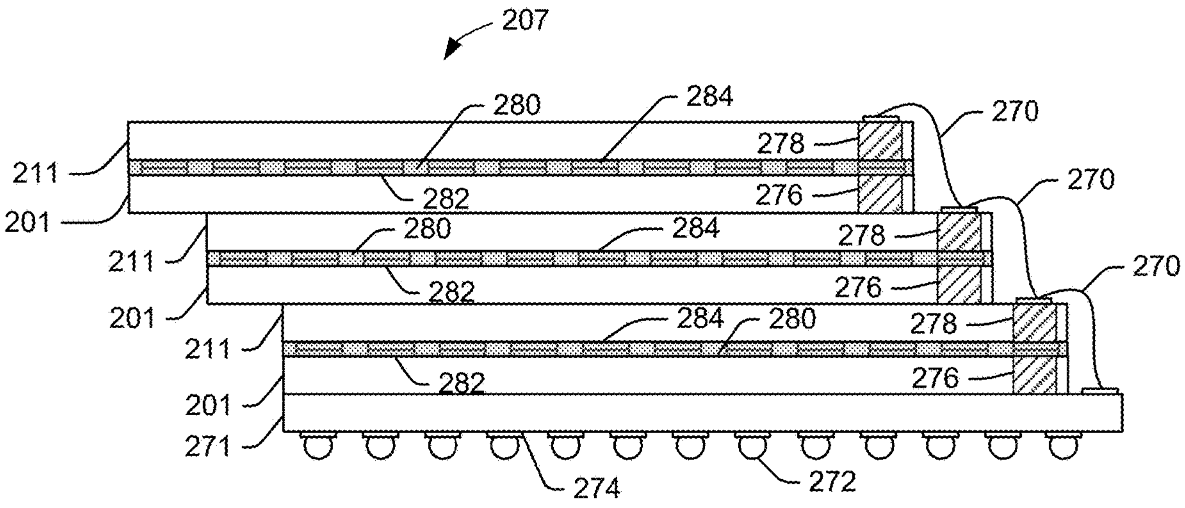
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
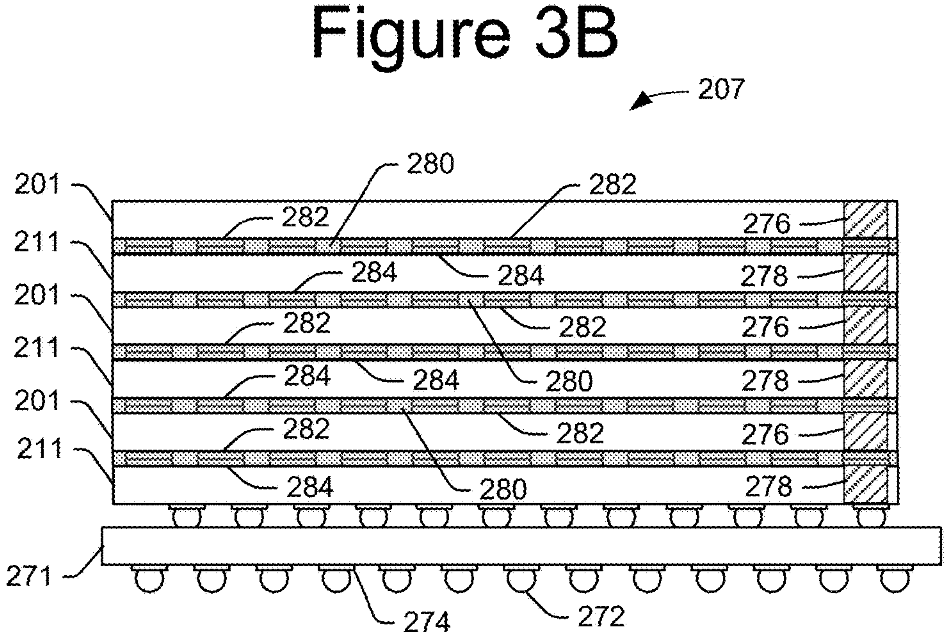

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
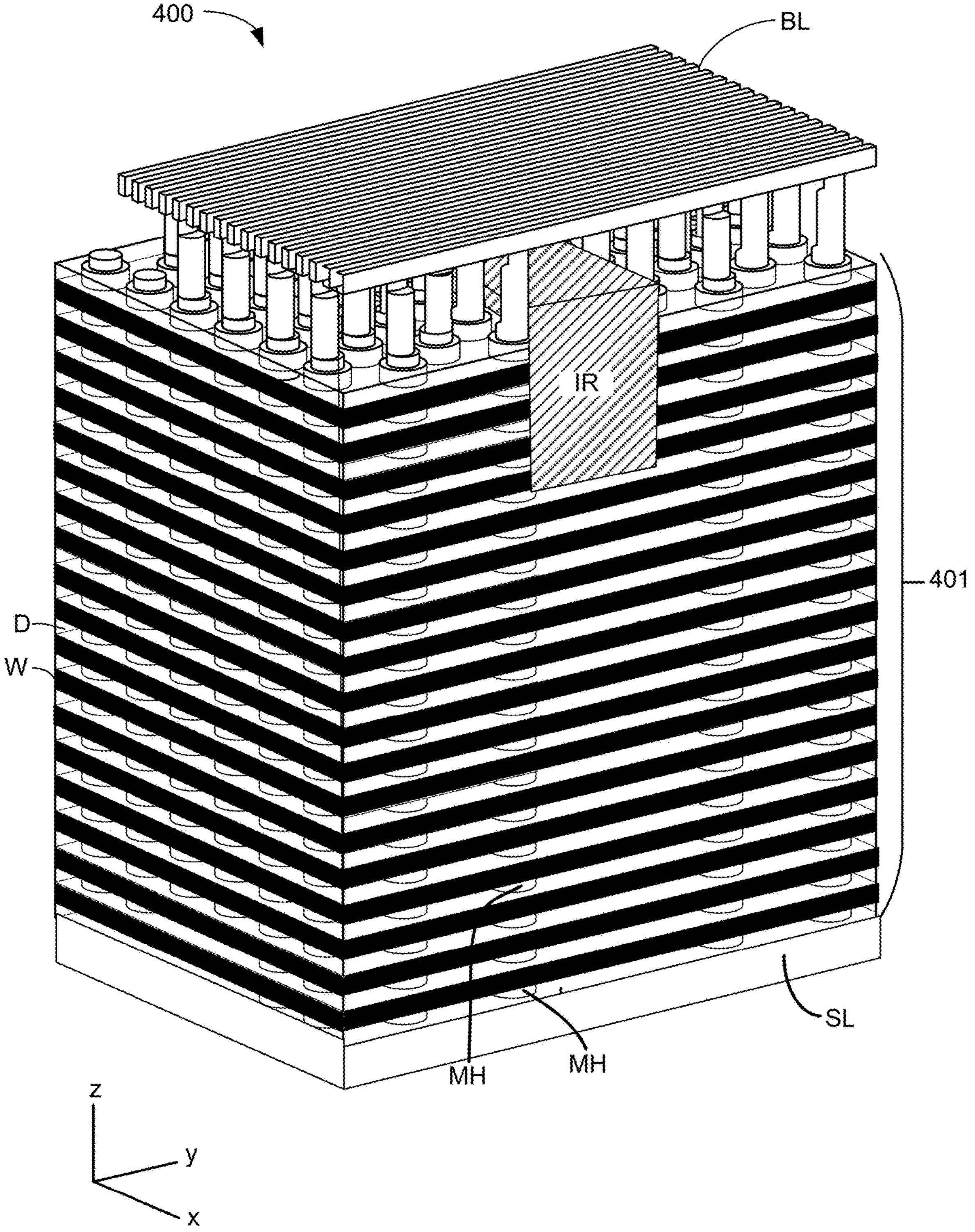
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
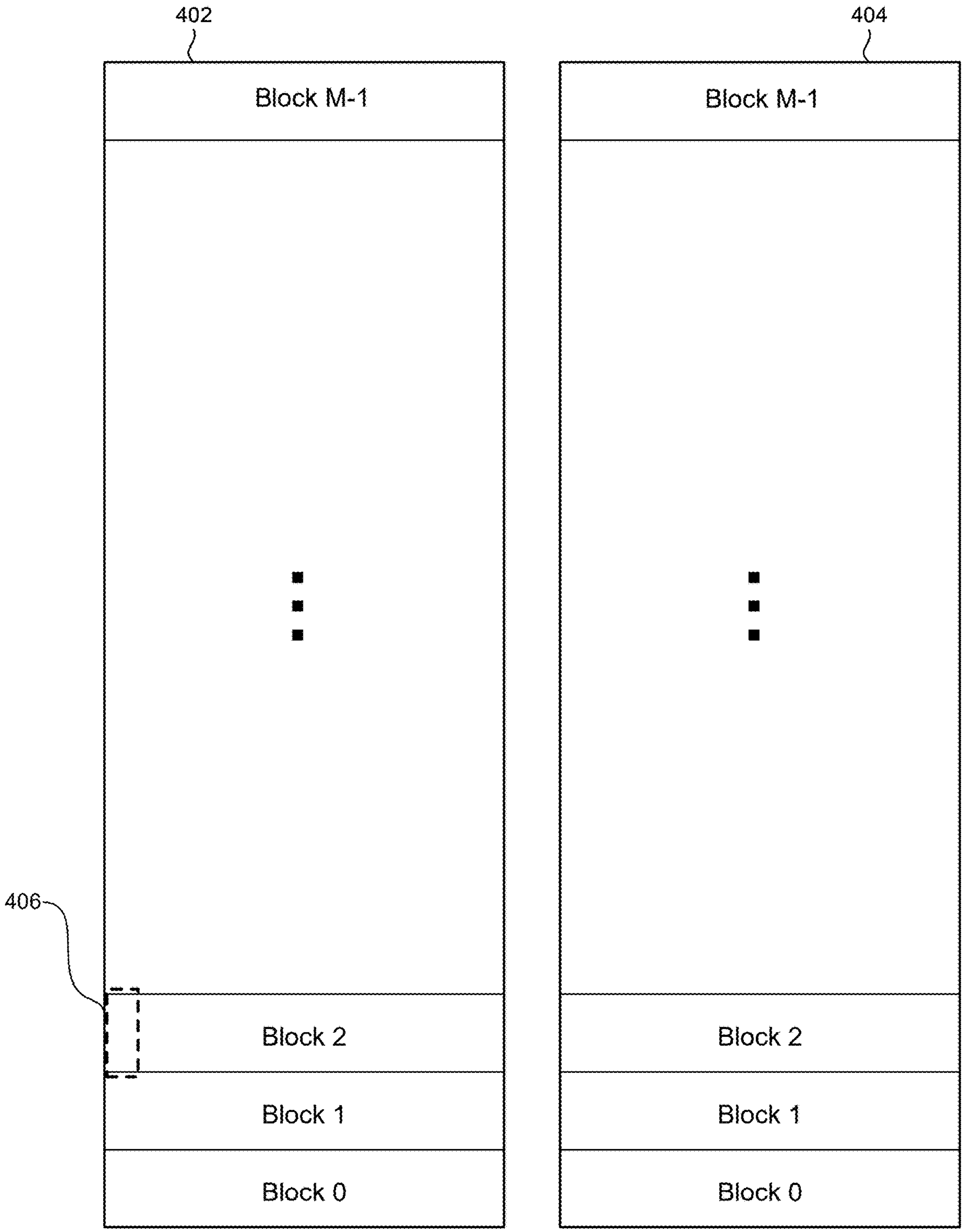
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
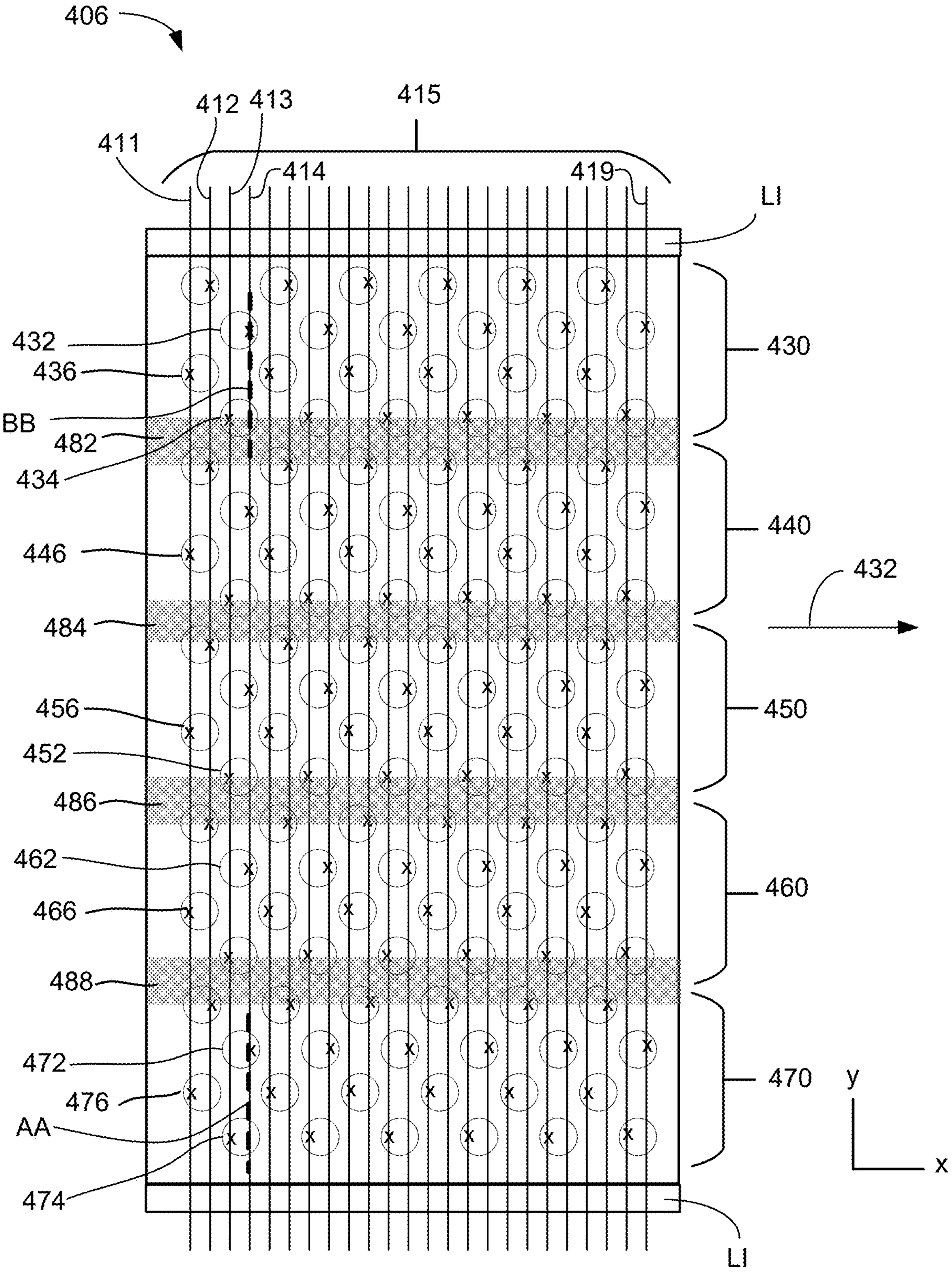
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side select lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
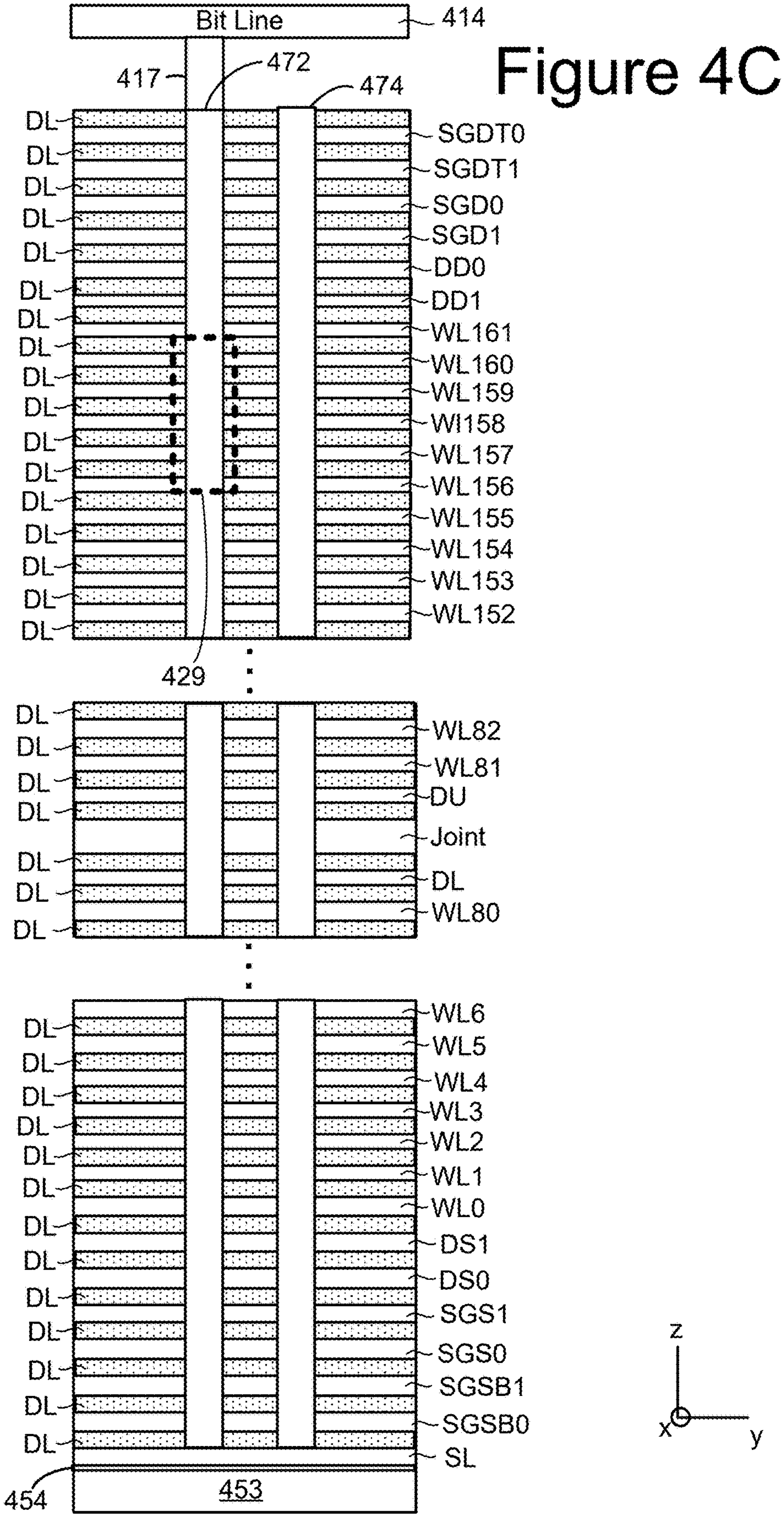
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt on junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For case of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
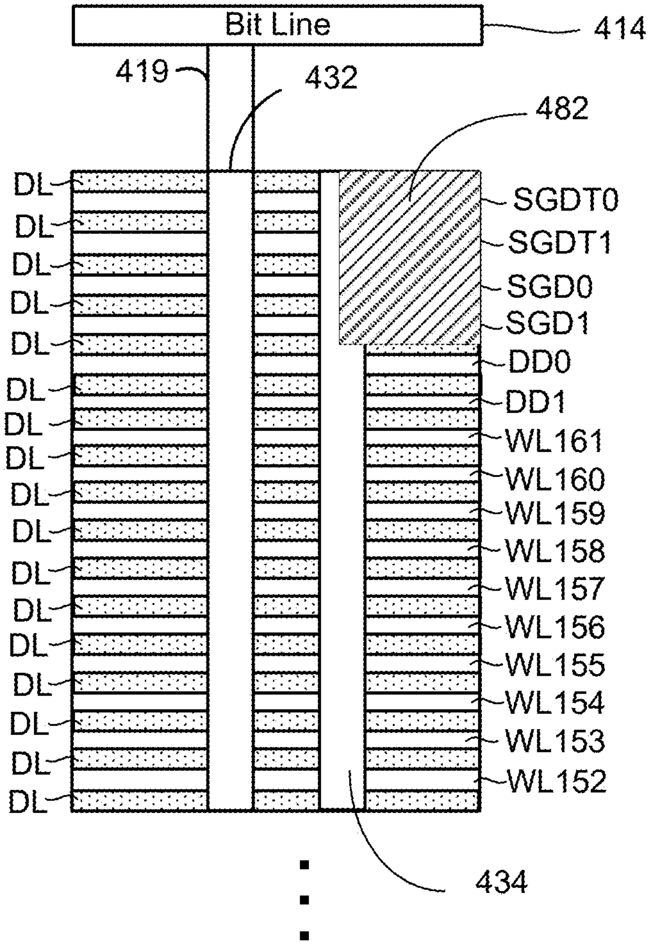
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488 occupy space that would have been used for a portion of the memory holes/vertical columns/NAND strings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
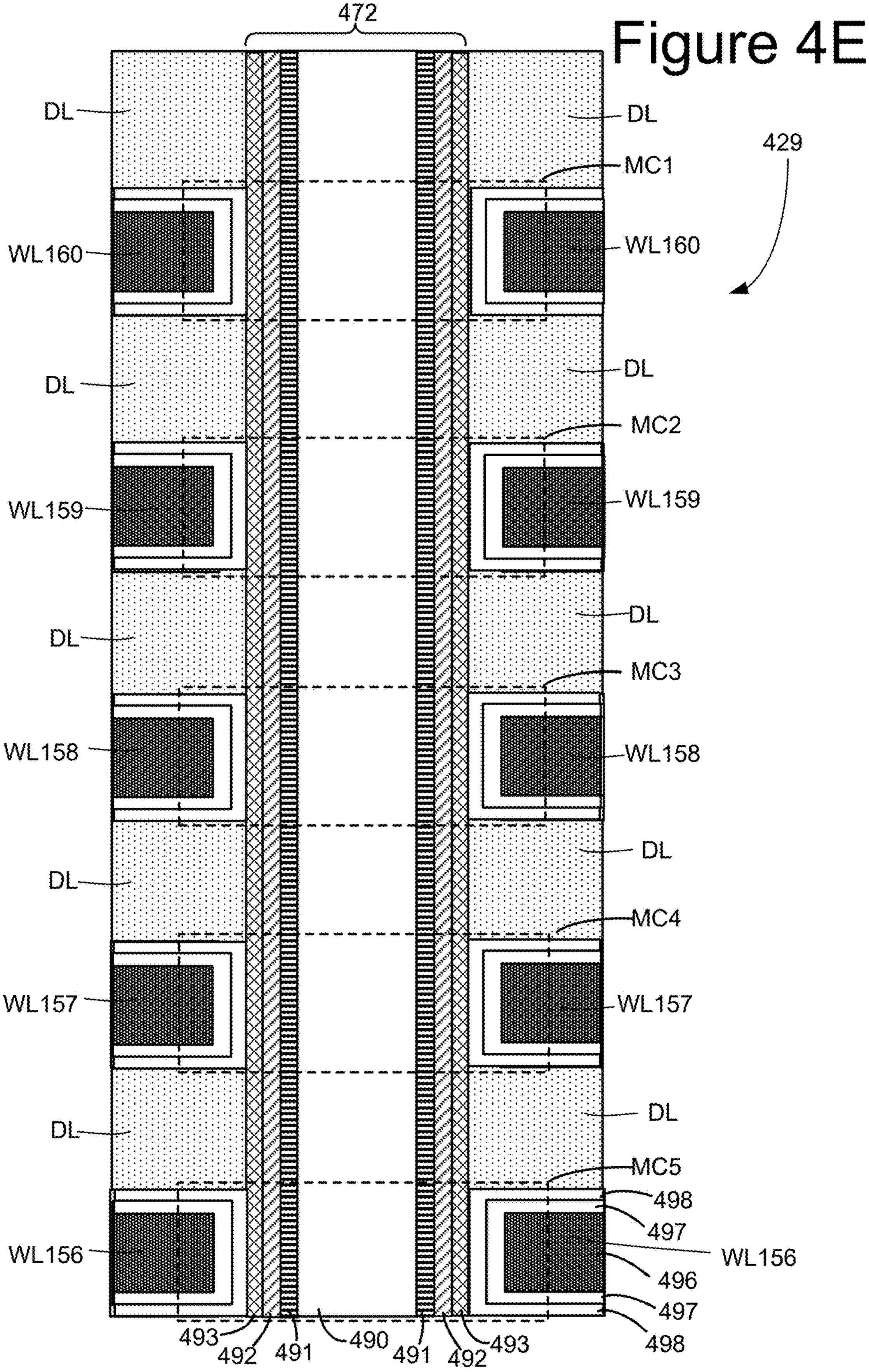
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
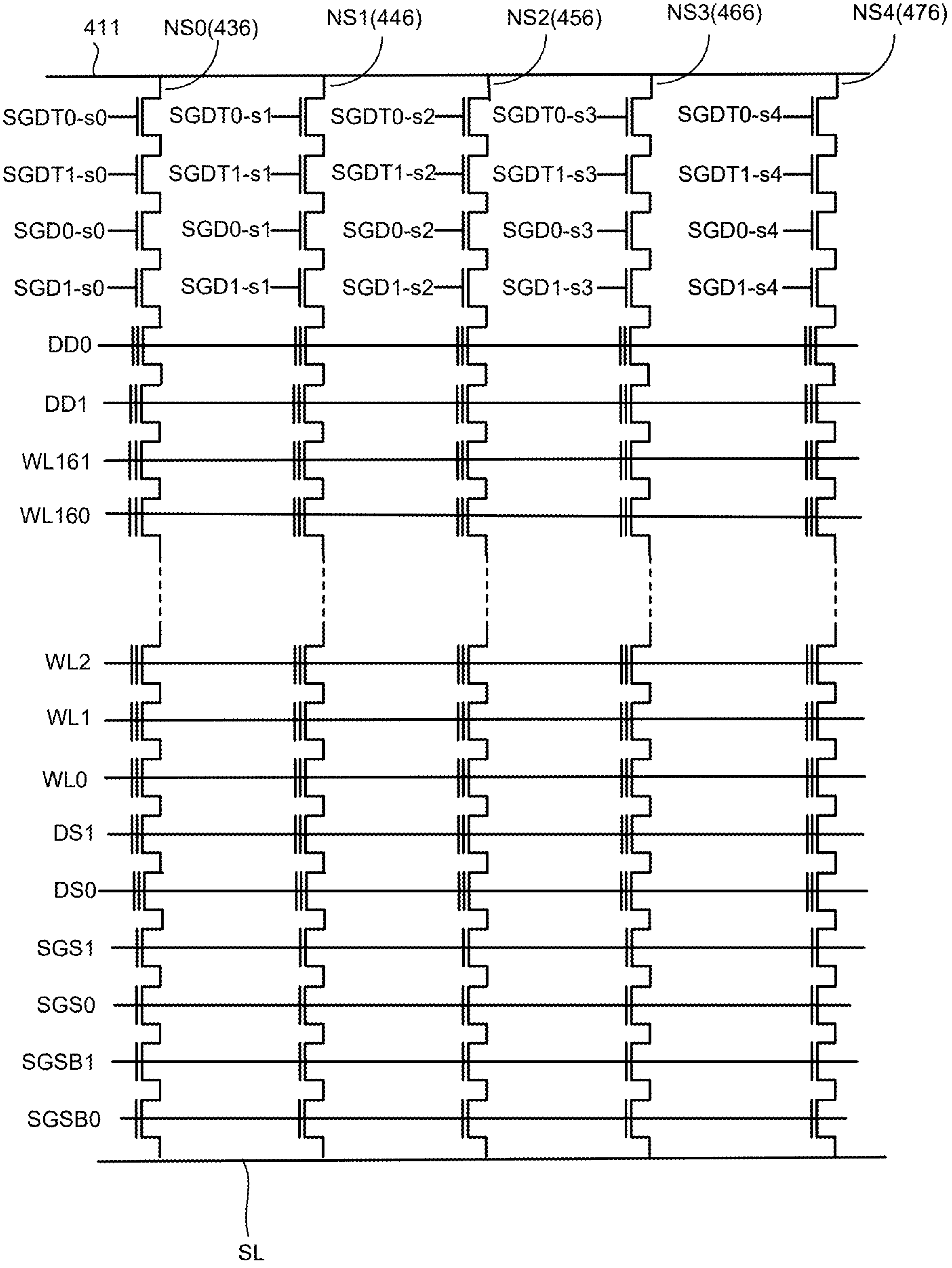
FIG. 4F is a schematic of a plurality of NAND strings in multiple regions of a same block.

FIG. 4F is a schematic diagram of a portion of the three dimensional memory array 202 depicted in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/vertical column 466 of region 460), and NAND string NS4 (which corresponds to memory hole/vertical column 476 of region 470).

Drain side select line/layer SGD0 is separated by isolation regions 482, 484, 486 and 488 to form SGD0-s0, SGD0-s1, SGD0-s2, SGD0-s3 and SGD0-s4 in order to separately connect to and independently control regions 430, 440, 450, 460, 470. Similarly, drain side select line/layer SGD1 is separated by isolation regions 482, 484, 486 and 488 to form SGD1-s0, SGD1-s1, SGD1-s2, SGD1-s3 and SGD1-s4 in order to separately connect to and independently control regions 430, 440, 450, 460, 470; drain side GIDL generation transistor control line/layer SGDT0 is separated by isolation regions 482, 484, 486 and 488 to form SGDT0-s0, SGDT0-s1, SGDT0-s2, SGDT0-s3 and SGDT0-s4 in order to separately connect to and independently control regions 430, 440, 450, 460, 470; drain side GIDL generation transistor control line/layer SGDT1 is separated by isolation regions 482, 484, 486 and 488 to form SGDT1-s0, SGDT1-s1, SGDT1-s2, SGDT1-s3 and SGDT1-s4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
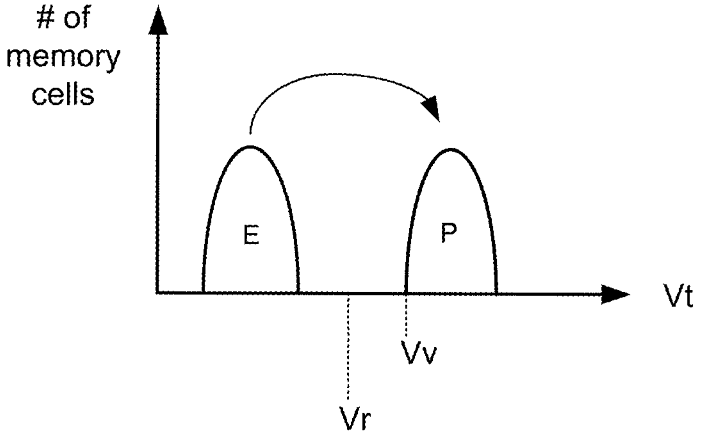
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
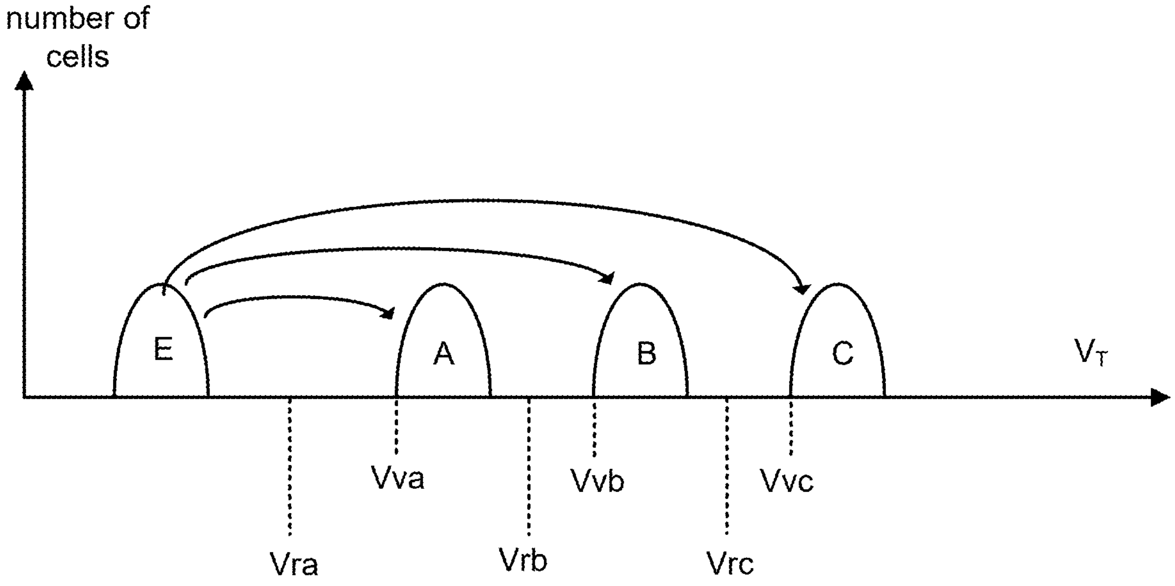
FIG. 5B depicts threshold voltage distributions.
Figure 5C:
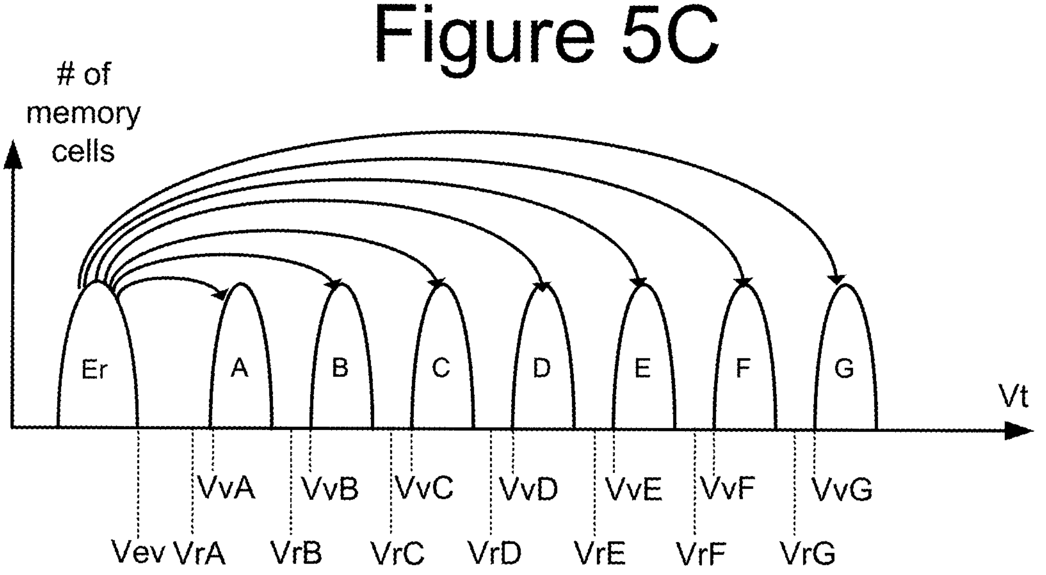
FIG. 5C depicts threshold voltage distributions.
Figure 5D:
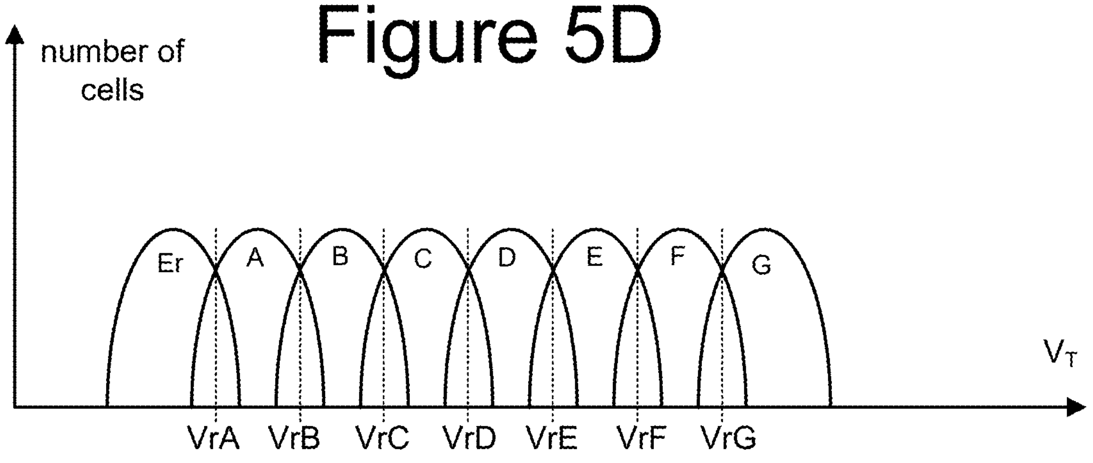
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

| | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

| | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VIC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5C shows no overlap between threshold voltage distributions. FIG. 5D depicts an embodiment where each memory cell stores three bits of data per memory cells and the threshold voltage distributions overlap with one or more neighboring threshold voltage distributions. For example, the threshold voltage distribution for data state B overlaps with the threshold voltage distributions for data states A and C. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities.

Figure 5E:
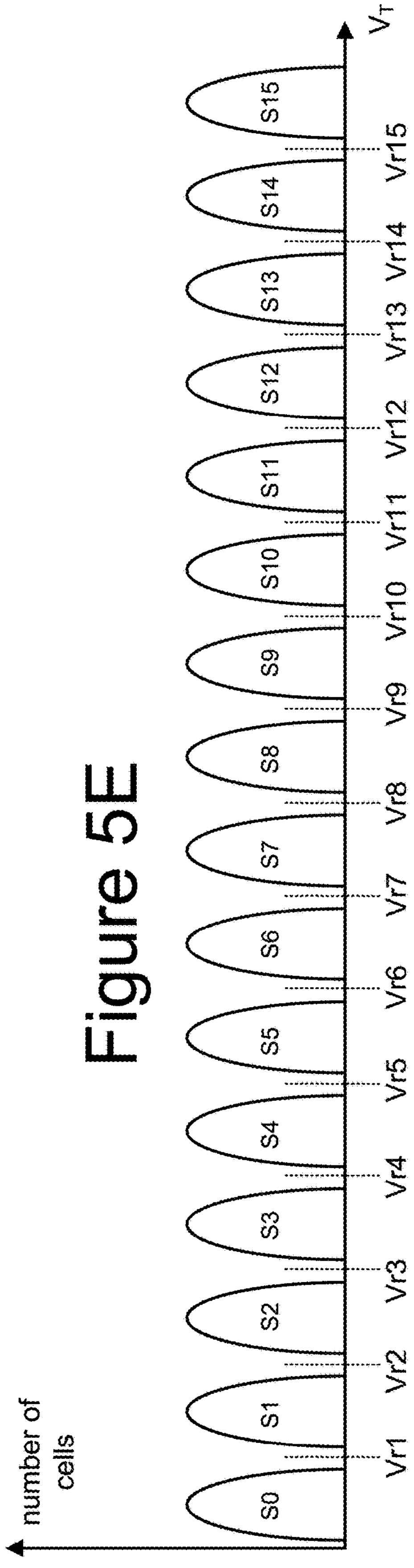
FIG. 5E depicts threshold voltage distributions.

FIG. 5E depicts threshold voltage distributions when each memory cell stores four bits of data, which is another example of MLC data. FIG. 5E depicts that the non-volatile memory cells are programmed into a set of data states defined by threshold voltage distributions. In the embodiment of FIG. 5E, the data states are S0, S1, S2, S3, S4, S5, S6, S7, S8, S9, S10, S11, S12, S13, S14 and S15. S0 is the erased data state. S1-S15 are the programmed data states. The threshold voltage distributions of FIG. 5E will include read reference voltages and verify reference voltages, as discussed above. However, to make FIG. 5E easier to read only the read reference voltages are depicted. For example, FIG. 5E shows read reference voltages Vr1, Vr2, Vr3, Vr4, Vr5, Vr6, Vr7, Vr8, Vr9, Vr10, Vr11, Vr12, Vr13, Vr14 and Vr15.

Figure 5F:
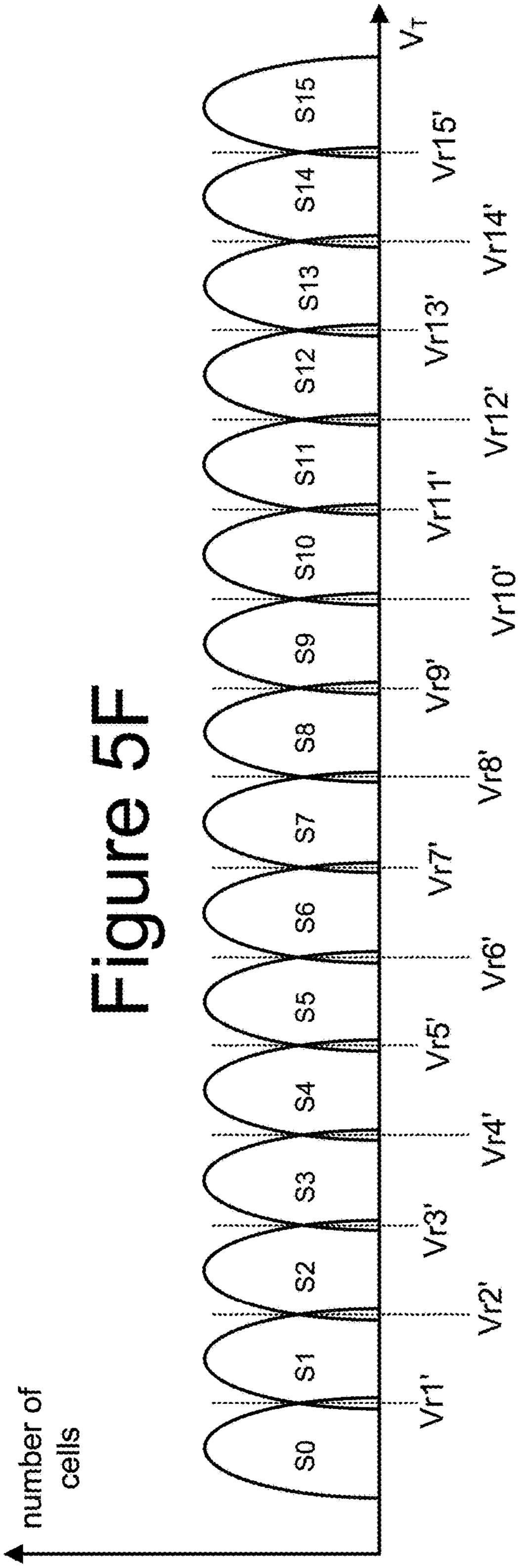
FIG. 5F depicts threshold voltage distributions.

FIG. 5F depicts threshold voltage distributions when each memory cell stores four bits of data and the threshold voltage distributions overlap with one or more neighboring threshold voltage distributions. FIG. 5F shows data states S0-S15 and a set of read reference voltages Vr1', Vr2', Vr3', Vr4', Vr5', Vr6', Vr7', Vr8', Vr9', Vr10', Vr11', Vr12', Vr13', Vr14' and Vr15'.

When using four bits per memory cell, the memory can be programmed using the full sequence programming discussed above, or multi-pass programming processes known in the art. Each threshold voltage distribution of FIGS. 5E and 5F corresponds to a data state (S0-S15) and predetermined values for the set of data bits. The specific relationship between the data programmed into the memory cell and the threshold voltage levels of the memory cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

Figure 6:
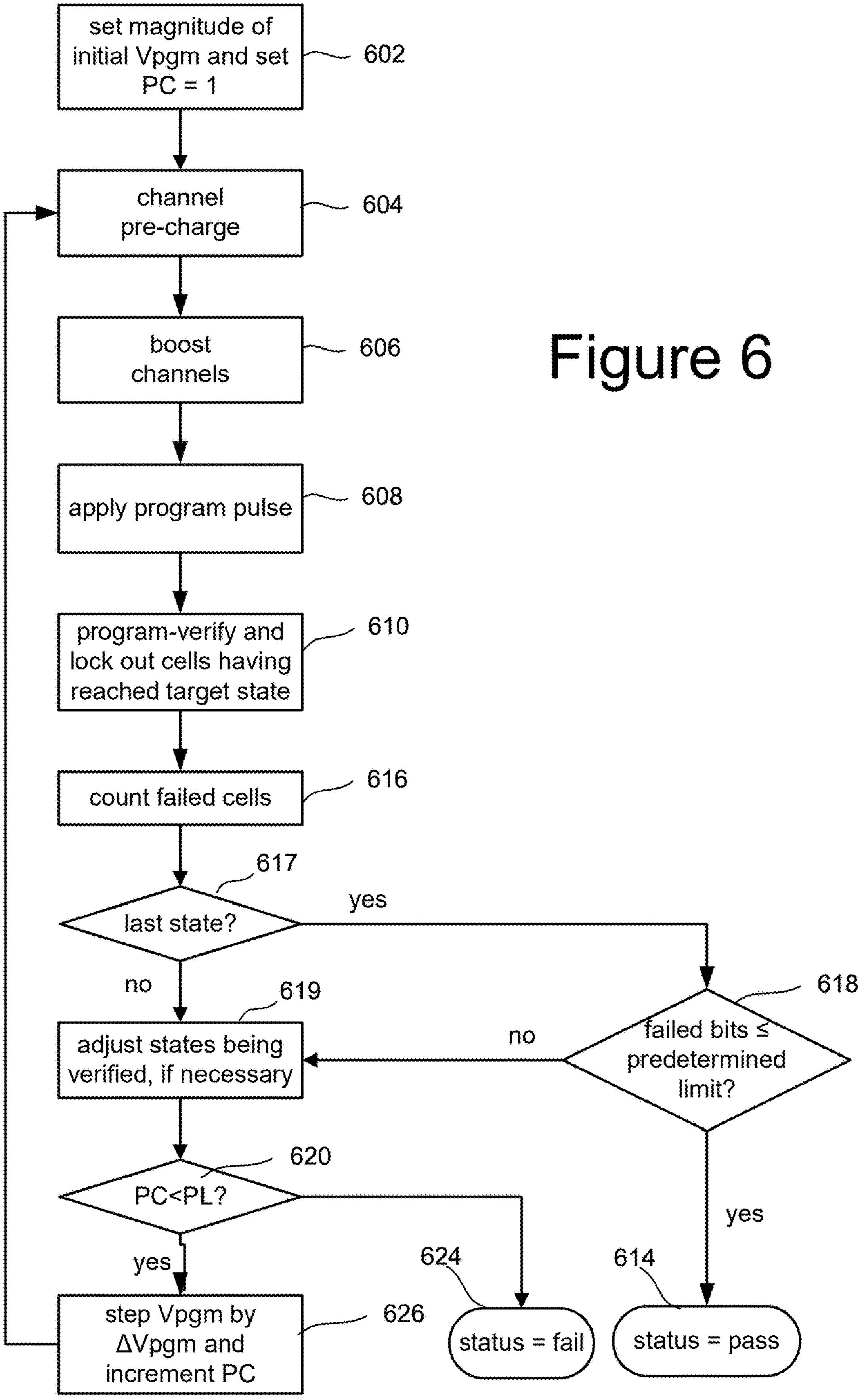
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-626). For example, the first program loop includes verifying for data state A (see FIG. 5C); depending on the result of the verify operation, the second program loop may perform verify for data states A and B; depending on the result of the verify operation the third program loop may perform verify for data states B and C; and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5E. In one embodiment, the control circuit is configured to program memory cells in the direction from the erased data state toward the highest data state (e.g., from data state Er to data state G) and erase memory cells in the direction from the highest data state toward the erased data state (e.g., from data state G to data state Er).

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGSB0, and SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1) that is connected to or near a bit line to generate a first GIDL current. A second GIDL voltage may be created between two terminals of a GIDL generation transistor (e.g., SGSB0, SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
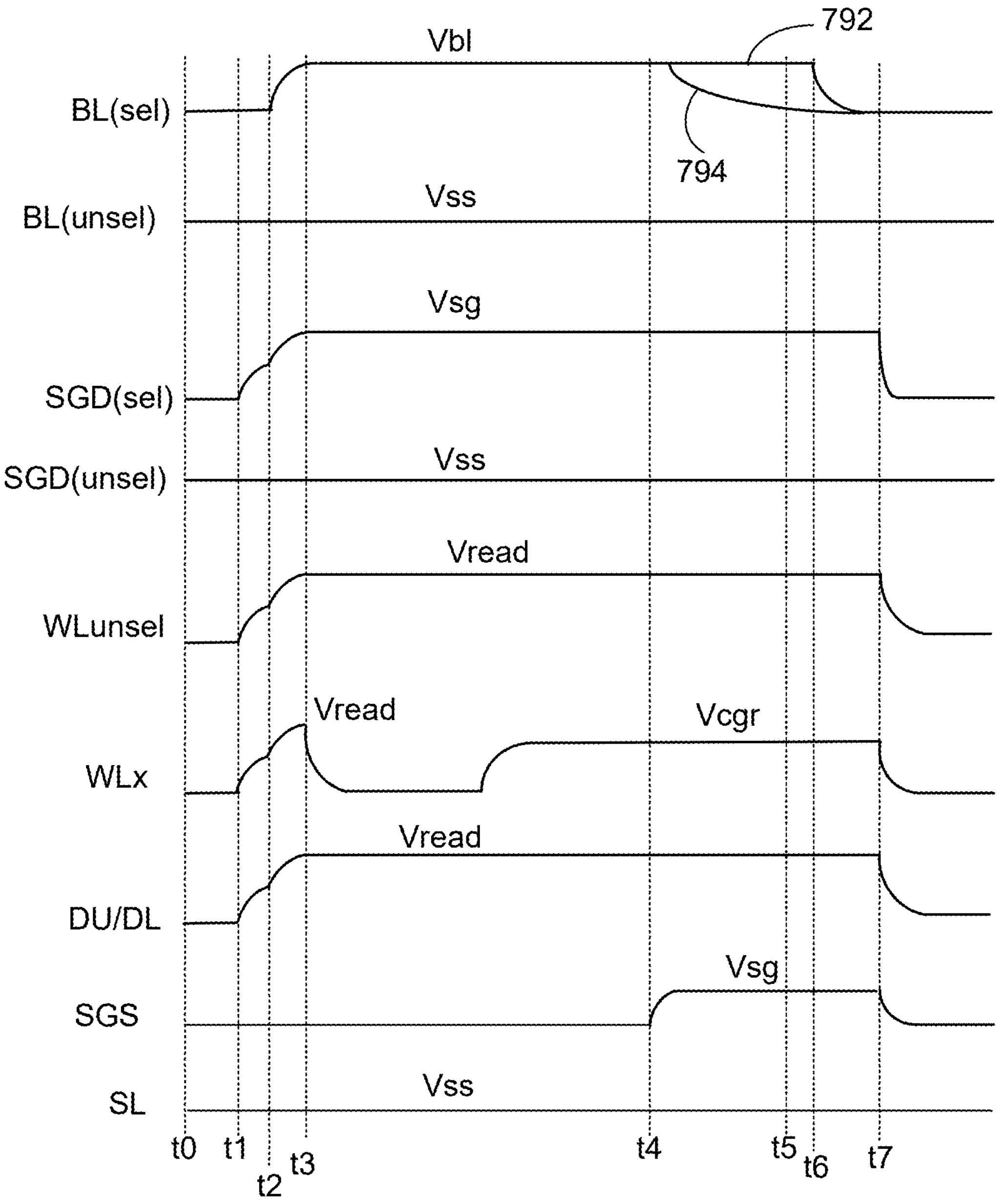
FIG. 7 is a timing diagram describing one embodiment of a read operation.

FIG. 7 is a timing diagram depicting the behavior of various signals when sensing data during a read operation or a program verify operation. FIG. 7 depicts the following signals: BL (sel), BL (unsel), SGD (sel), SGD (unsel), WLunsel, WLx, DU/DL, SGS and SL. The signal BL (sel) is the voltage applied to bit lines connected to NAND strings having memory cells selected for reading. The signal BL (unsel) is the voltage applied to bit lines connected to NAND strings that do not have any memory cells selected for reading. The signal SGD (sel) is the voltage applied to the drain side select (SGD) lines (e.g., SGD0 and SGD1 connected together for one region) for the region (e.g., regions 430, 440, 450, 460 and 470) selected for programming. The signal SGD (unsel) is the voltage applied to the drain side select (SGD) lines (e.g., SGD0 and SGD1 connected together for one region) for the regions (e.g., regions 430, 440, 450, 460 and 470) not selected for programming. The signal WLx is the voltage applied to the word line selected for reading/verifying. The signal WLunsel is the voltage applied to the word lines not selected for reading. DU/DL is the signal applied to the dummy word lines DU and DL, which are adjacent to the Joint area. SGS is the source side select lines (e.g., SGS0 and SGS1 connected together for one region). SL is the source line.

At time t0 of FIG. 7, all signals depicted in FIG. 7 are at Vss (ground or 0 volts). At time t1, SGD (sel), WLunsel, WLx and DU/DL are raised to Vdd (e.g., ~3 volts) as part of a step process of ramping up to target voltages. At time t2, BL (sel) is raised to Vbl (e.g., 0.5-1.5v). Also at time t2, DU/DL, WLx and WLunsel are raised from Vdd to Vread (e.g., 6-8 volts). Vread is an example of an overdrive voltage because it is high enough to turn on the memory cell regardless of which data state the memory cell has been programmed to. Vpass (used during programming) is another example of an overdrive voltage. Other overdrive voltages can also be used. Also at time t2, SGD (sel) is raised from Vdd to Vsg (e.g., 3.5-6v), an example of a sense enabling voltage. At t3, WLx is lowered back to ground. Raising WLx to Vread (t1-t3) and then lowering WLx back down to ground at t3 is known as a Vread spike. The purpose of the Vread spike is to avoid injection read disturb. WLx is subsequently raised to Vcgr (e.g., one of the read reference voltages VrA, VrB, VrC, VrD, VrE, VrF, and VrG of FIG. 5C) between t3 and t4 . . . . If the system is performing a verify operation than Vegr is one of the verify reference voltages (e.g., VvA, VvB, VvC, VvD, VVE, VVF, and VvG of FIG. 5C) applied to WLx. When performing erase verify, Vev (see FIG. 5C) can be applied. At time t4, SGS is raised to Vsg, which provides a path for the bit line voltage to dissipate. If Vcgr is greater than the threshold voltage of the selected memory cells, then the selected memory cells will conduct current and the bit line voltage will dissipate via the source line, as depicted by curve 794. If Vegr is not greater than the threshold voltage of the selected memory cells, then the selected memory cells will not conduct current and the bit line voltage will not dissipate via the source line, as depicted by curve 792. The sense amplifiers will sense whether the selected memory cell conducted or not at time t5. At time t6, BL (sel) is lowered to Vss. At time t7, SGD (sel), WLunsel, WLx, and SGS are lowered to Vss. When sensing at t5, the results of the sensing are stored in a latch at the respective sense amplifier. Afterwards, the system (e.g., control circuit) scans all of the latches of the sense amplifiers to determine which memory cells conducted and which did not conduct.

Some non-volatile memory can suffer from data retention issues, including memory cells' threshold voltages drifting over time after programming. The longer data remains in a memory cell, the greater the chance and the greater the degree of memory cells' threshold voltages drifting. If memory cells' threshold voltages drift too much, then the memory system may experience an error when trying to read the data.

To compensate for the above-identified data retention issue, it is proposed to perform on-chip (e.g., on the memory die) tracking of threshold voltages and adjust the reference levels used for reading based on the tracking of threshold voltages. To reduce the impact of tracking threshold voltages on the time needed for reading, the process of tracking threshold voltages is implemented by sensing the non-volatile memory cells for multiple conditions during a single ramping up of a voltage signal applied to the non-volatile memory cells as part of the read process. The results of this sensing is used to determine whether to shift the reference levels used for reading.

Figure 8:
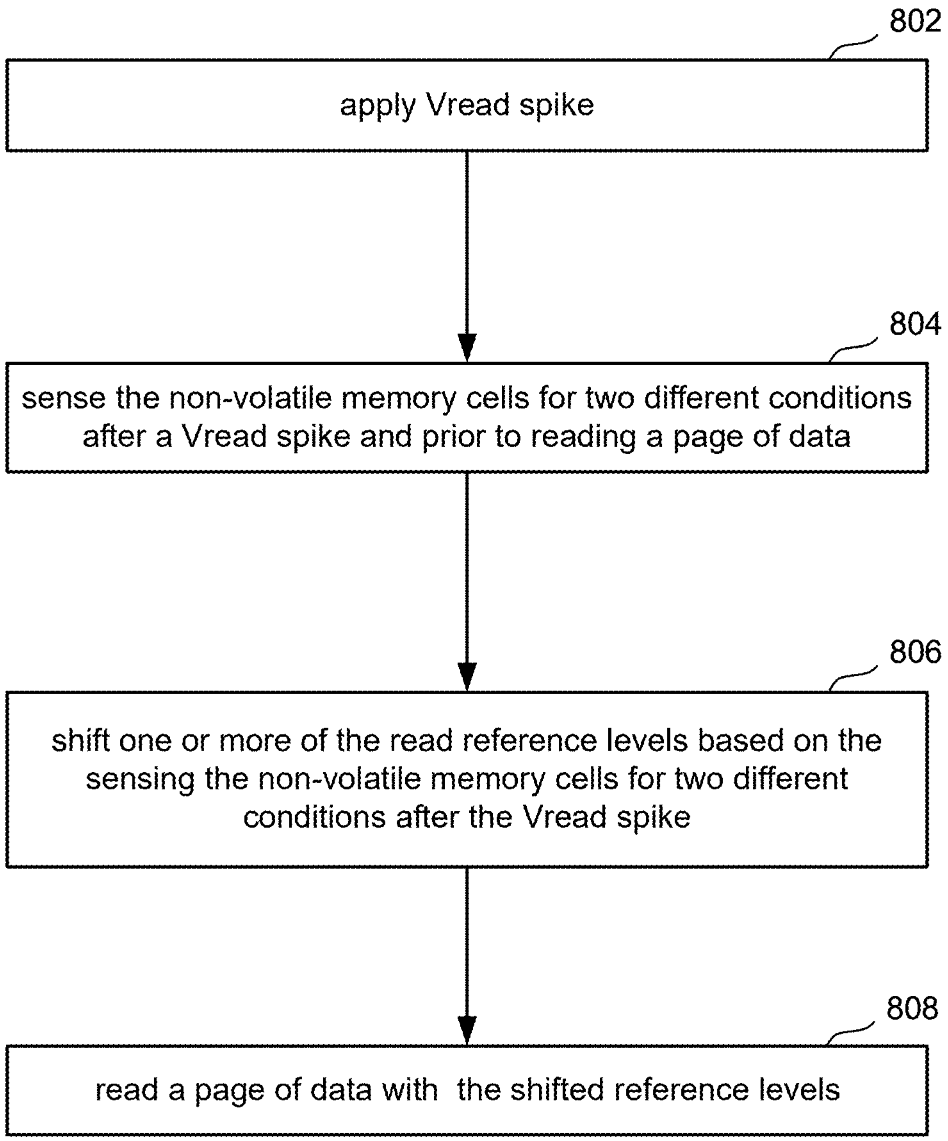
FIG. 8 is a flow chart describing one embodiment of a process for updating read reference voltages and reading.

FIG. 8 is a flow chart describing one embodiment of a process for reading that includes tracking threshold voltages and shifting the reference levels used for reading based on the tracking. In some example implementations, the process of FIG. 8 can be performed by any one of the one or more control circuits discussed above. The process of FIG. 8 can be performed entirely by a control circuit on memory die 200 (see FIG. 2A) or entirely by a control circuit on integrated memory assembly 207 (see FIG. 2B), rather than by memory controller 120. In one example, the process of FIG. 8 is performed by or at the direction of state machine 262, using other components of System Control Logic 260, Column Control Circuitry 210 and Row Control Circuitry 220. In another embodiment, the process of FIG. 8 is performed by memory controller 120 in combination with System Control Logic 260, Column Control Circuitry 210 and Row Control Circuitry 220. In some embodiments, the process of FIG. 8 is performed on any of the non-volatile memories discussed above.

In step 802 of FIG. 8, the control circuit applies a Vread spike to the selected word line connected to the non-volatile memory cells selected for reading. For example, FIG. 7 depicts step 802 between t1 and t3 when WLx is raised to Vread and then lowered down to ground at t3. After the Vread spike, in step 804 the control circuit senses the non-volatile memory cells selected for reading for two different conditions. Step 804 is performed before reading the non-volatile memory cells selected for reading. In one embodiment, the two conditions are whether the threshold voltage of the memory cells is at one of the read reference voltages and whether the threshold voltage of the memory cells is at one of the read reference voltages plus an offset. In one example implementation, step 804 includes sensing at Vr15 (see FIG. 5E) and Vr15+, where Vr15+=Vr15+Δ [or Vr15+=Vr15−Δ] (e.g., Δ=25 mV-200 mV). In other embodiments, other read reference voltages can be used. In other embodiments, other conditions can be used.

In other embodiments of the technology proposed herein, the control circuit is configured to program the non-volatile memory cells into a set of data states defined by current distributions. In these embodiments (and other implementations), the two conditions sensed at (tested for) in step 804 can include two different memory cell currents. Additionally, in these embodiments, the read reference levels can include voltages or currents.

In step 806, the control circuit shifts none, all or some of the read reference levels based on the sensing of step 804. For example, the control circuit shifts all or some of the read reference voltages Vr1-Vr15 (or VrA-VrG).

In step 808, the control circuit reads a page of data using the read reference levels (with none, all or some of the read reference levels being shifted). Step 808 corresponds to the sensing between t4-17 of FIG. 7. To implement steps 804 and 806, the signal diagram of FIG. 7 would need to be adjusted, as discussed below, to add the sensing of step 804 after t3 and before t4.

Figure 9:
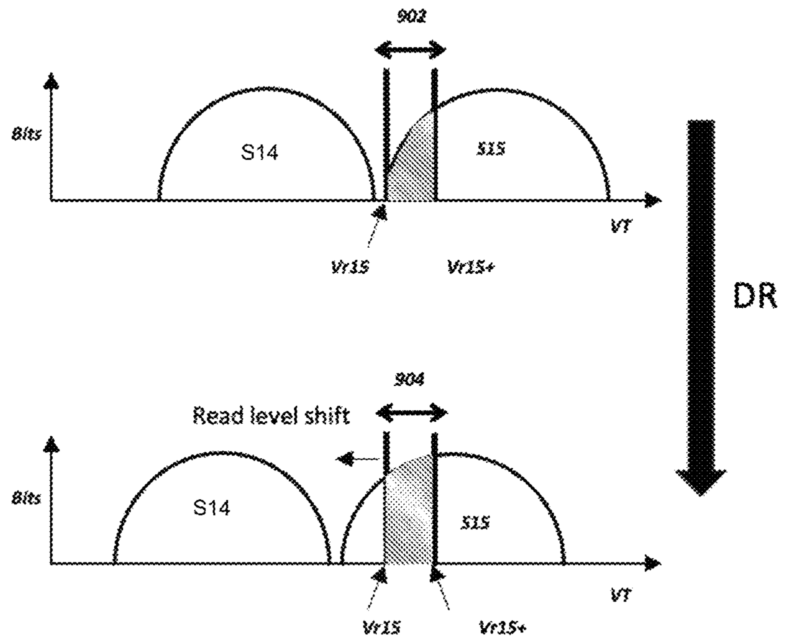
FIG. 9 depicts threshold voltage distributions.

FIG. 9 depicts two graphs, each of which shows two threshold voltage distributions, that help explain the process of FIG. 8 (reading that includes tracking threshold voltages and shifting the reference levels used for reading based on the tracking). The top graph of FIG. 9 represents threshold voltages of non-volatile memory cells immediately after programming data in the non-volatile memory cells. The bottom graph of FIG. 9 represents threshold voltages of non-volatile memory cells much later in time after programming such that many of the non-volatile memory cells have suffered from data retention issues including threshold voltages that have drifted down in magnitude.

The top graph of FIG. 9 (immediately after programming) shows sensing at Vr15 (see FIG. 5E) and Vr15+, where Vr15+=Vr15+Δ (e.g., Δ=25 mV-200 mV). The portion of the threshold voltage distribution for S15 corresponding to memory cells having threshold voltages greater than the Vr15 (e.g., a first threshold voltage) and less than or equal to Vr15+ (a second threshold voltage) is shaded as area 902.

The bottom graph of FIG. 9 (after data retention issues are experienced) also shows sensing at Vr15 (see FIG. 5E) and Vr15+ (step 804 of FIG. 8). The portion of the threshold voltage distribution for S15 in the bottom graph corresponding to memory cells having threshold voltages greater than the Vr15 (e.g., a first threshold voltage) and less than or equal to Vr15+ is shaded as area 904. As can be seen, region 904 is greater in area than region 902. This is because more memory cells have threshold voltages greater than the Vr15 and less than or equal to Vr15+ after data retention issues (significant time elapsed after programming data) than as compared to when the same set of memory cells were freshly programmed. The control circuit can count the number of memory cells have threshold voltages greater than the Vr15 and less than or equal to Vr15+ after data retention issues (significant time elapsed after programming data) and compare that number to the number of memory cells had threshold voltages greater than the Vr15 and less than or equal to Vr15+ immediately after programming. Based on the difference in the two numbers, the control circuit can estimate the amount of drift in threshold voltage due to data retention issues. In another embodiment, simulation and/or experimentation can be used to provide an estimate of the number of memory cells that have threshold voltages greater than the Vr15 and less than or equal to Vr15+ immediately after programming. In yet another embodiment, the system estimates the amount of drift in threshold voltage due to data retention issues based only on counting the number of memory cells having threshold voltages greater than Vr15 and less than or equal to Vr15+ later in time after programming data (after data retention issues manifest). The estimate of the amount of drift in threshold voltage due to data retention issues is used to shift the read reference levels (e.g., such as one or more of read reference voltages Vr1-Vr15) such that the read reference levels are at appropriate levels to distinguish data states. For example, due to the data retention issues, Vr15 in the lower graph of FIG. 9 is no longer between threshold voltages distributions; therefore, the control circuit will shift Vr15 down so that Vr15 is between the threshold voltage distributions for S15 and the threshold voltage distributions S14 (see step 806 of FIG. 8). Once Vr15 is appropriately shifted, the control circuit can perform a read process using the shifted Vr15 (see step 808).

Figure 10:
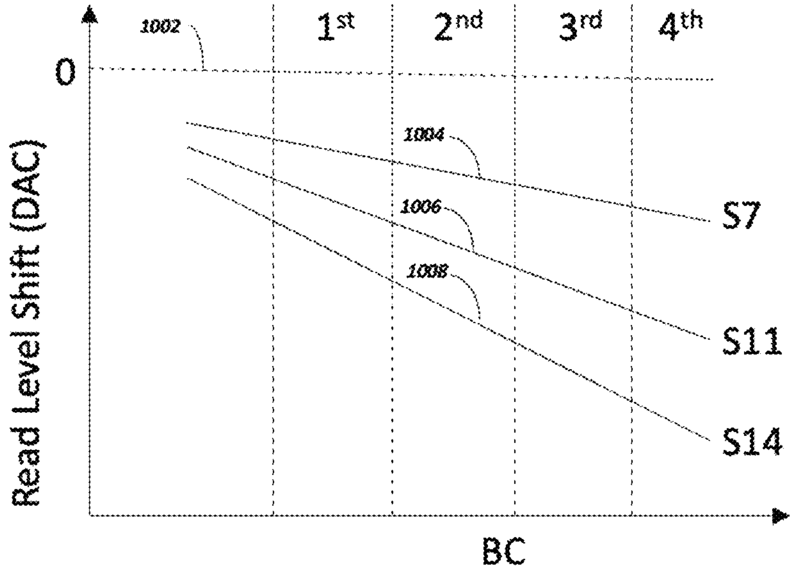
FIG. 10 is a graph plotting bit count versus shift in read reference voltages.

As discussed above with respect to FIG. 9, some embodiments include counting the number of memory cells having a threshold voltage greater than a first threshold voltage (e.g., Vr15) and less than or equal to a second threshold voltage (e.g., Vr15+). This count of memory cells can be referred to as a Bit Count (BC). FIG. 10 is a graph of BC versus the amount that the read reference voltages should be shifted. In one embodiment, the voltages applied on the memory die are controlled by a digital-to-analog converter (DAC), which is a circuit that converts a binary input number into an analog voltage output. Thus, the amount of shift for the read reference voltages is plotted as changes in DAC units. FIG. 10 shows four example curves/lines for one example embodiment. Horizontal line 1002 represents zero change in read reference voltage in response to data retention issues. Line 1004 represents data for memory cells that have been programmed to data state S7 (see FIG. 5E). Line 1006 represents data for memory cells that have been programmed to data state S11 (see FIG. 5E). Line 1008 represents data for memory cells that have been programmed to data state S14 (see FIG. 5E). FIG. 10 shows data for data states S7, S11 and S14 for example purposes only, and the memory system will also have data for the other data states not depicted. One method for performing step 806 of FIG. 8 is to use the BC to find the shift for each data state (or a subset of data states) using the graph of FIG. 10. Another embodiment uses the tables of FIGS. 11-13 to determine the shift for each data state (or a subset of data states).

FIG. 11 is a table that identifies which portion of the table of FIG. 12 should be used to find the shift for each data state (or a subset of data states). The left-hand column of FIG. 11 is BC. FIG. 11 shows example values for BC for a population of 4K memory cells. Other numbers for BC and other sized populations of memory cells can also be used (e.g., including 1K, 16K, etc.). Based on BC, one of the 1$^{st}$ table, 2$^{nd}$ table, 3$^{rd}$ table or 4$^{th}$ table are chosen. Note that FIG. 10 graphically depicts the correlation of BC to 1$^{st}$ table, 2$^{nd}$ table, 3$^{rd}$ table or 4$^{th}$ table.

FIG. 12 is a table that defines parameters for the memory system (e.g., the control circuit) to convert BC to a shift of the read reference voltages in DAC units. In one example embodiment, each DAC unit is 12.5 millivolts; therefore, a read reference voltage can be adjusted in multiples of 12.5 millivolts. In other embodiment, other magnitudes of DAC units can be used.

In one embodiment, the control circuit is configured to shift one or more of the read reference levels differently for different data states. Thus, the table of FIG. 12 has multiple rows, with each row providing information on how to shift read reference levels for one or more data states. For example, the first row provides information for data state S1 with respect to a parameter DVCG_SIR_DR_xxx, the second row provides information for data state S2 and data state S3 with respect to a parameter DVCG_S2S3R_DR_xxx, the third row provides information for data state S4 and data state S5 with respect to a parameter DVCG_S4S5R_DR_xxx, the fourth row provides information for data state S6 and data state S7 with respect to a parameter DVCG_S6S7R_DR_xxx, the fifth row provides information for data state S8 and data state S9 with respect to a parameter DVCG_S8S9R_DR_xxx, the sixth row provides information for data state S10 and data state S11 with respect to a parameter DVCG_S10S11R_DR_xxx, the seventh row provides information for data state S12 and data state S13 with respect to a parameter DVCG_S12S13R_DR_xxx, the eighth row provides information for data state S14 with respect to a parameter DVCG_S14R_DR_xxx, and the ninth row provides information for data state S15 with respect to a parameter DVCG-S15R_DR_xxx.

The table of FIG. 12 actually includes four tables, labeled $1^{st}$, $2^{nd}$, $3^{rd}$ and $4^{th}$. Each line of each table describes how to convert BC to a shift of the read reference levels in DAC units for one or more data states. Each table includes four columns: Bit, Step, Start and End. The Bit column describes how many bits the parameter has to indicate an amount of shift to the corresponding read reference level and correlates to the number of possible shift values. The Step column indicates the amount of difference in voltage magnitude between the different possible shift values. The Start column indicates the first possible shift value (in DAC units). The End column indicates the last possible shift value (in DAC units). The control circuit can use the values for Bit, Step, Start and End to create an additional table, as depicted in FIG. 13, to convert BC to shift of the read refence level.

To illustrate the use of FIGS. 8-13, consider the following example. During step 804 of FIG. 8, the control circuit senses a set of memory cells connected to a common word line at Vr15 and Vr15+ (as depicted in the bottom graph of FIG. 9). The number of memory cells counted to have threshold voltages greater than the Vr15 and less than or equal to Vr15+ is (in this example) is 108. Based on the table of FIG. 11, the control circuit knows to use the 2nd table of FIG. 12. The control circuit will then use each row of the 2nd table of FIG. 12 to determine a possible shift for each read reference voltage Vr1-Vr15 corresponding to data states S1-S15. For example, the shift in Vr11 is determined using the values in dashed box 1202, including: Bit=2, Step-4, Start=−14 and End=−2. Based on these numbers, the control circuit creates the table of FIG. 13, that includes four rows addressed by two bits (Bit=2). The amount of shift for [0,0] is −14 DAC (Start=−14). The amount of shift for [1,1] is −2 (End=−2). The control circuit (or memory controller) calculates the shift for [0,1] based on being 4 DAC units higher than [0,0] since Step=4. The control circuit (or memory controller) calculates the shift for [1,0] based on being 4 DAC units higher than [0,1] since Step=4. The control circuit chooses between the four values for the shift of Vr14 (−14, −10, −6 and −2) based on interpolation between Bit Count ranges of FIG. 11. In this example, the Bit Count of BC=108 is 40% of the way from 95 to 127 (see FIG. 11). If we assume that 0-24% corresponds to [0,0] of FIG. 13, 25%-49% corresponds to [0,1] of FIG. 13, 50%-74% corresponds to [1,0] of FIG. 13 and 75%-100% corresponds to [1,1] of FIG. 13, then in this example the control circuit will choose [0,1] and shift the read reference level of Vr11 down by 10 DAC units (e.g., shift VR11 down by 125 millivolts). This same process will be used for Vr1-Vr10 and Vr12-Vr15.

The process described above does a good job of updating the read reference levels to avoid errors when reading data stored in memory cells that have experienced drifts in threshold voltage due to data retention issues. However, the extra sensing (e.g., see step 804) does slow down the read process. Therefore, it is desired to decrease the time added to a read process in order to perform the extra sensing needed for updating the read reference levels.

To decrease the time added to a read process in order to perform the extra sensing needed for updating the read reference levels, it is proposed to perform the extra sensing during the Vread spike rather than after the Vread spike.

Figure 14:
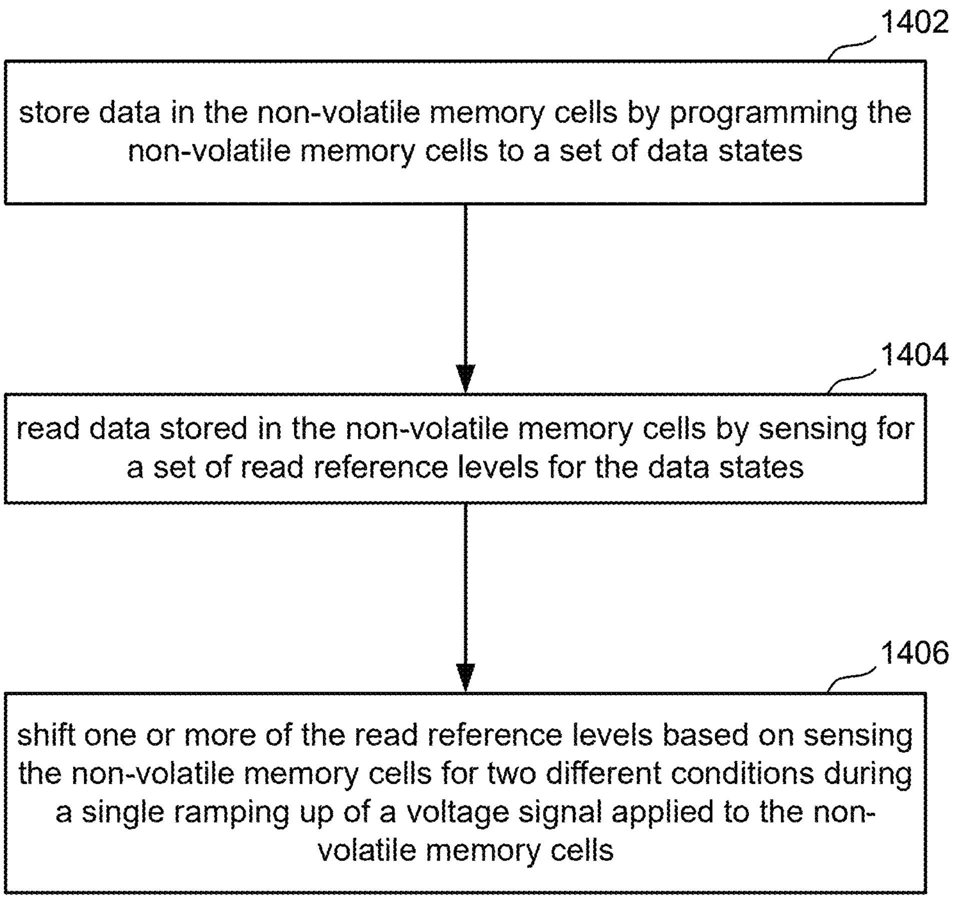
FIG. 14 is a flow chart describing one embodiment of a process for updating read reference voltages and reading.

FIG. 14 is a flow chart describing one embodiment of a process for reading that includes tracking threshold voltages and shifting the reference levels used for reading based on the tracking, such that extra sensing needed for the tracking is performed during the Vread spike rather than after the Vread spike. In some example implementations, the process of FIG. 14 can be performed by any one of the one or more control circuits discussed above. The process of FIG. 14 can be performed entirely by a control circuit on memory die 200 (see FIG. 2A) or entirely by a control circuit on integrated memory assembly 207 (see FIG. 2B), rather than by memory controller 120. In one example, the process of FIG. 14 is performed by or at the direction of state machine 262, using other components of System Control Logic 260, Column Control Circuitry 210 and Row Control Circuitry 220. In another embodiment, the process of FIG. 14 is performed by memory controller 120 in combination with System Control Logic 260, Column Control Circuitry 210 and Row Control Circuitry 220. In some embodiments, the process of FIG. 14 is performed on any of the non-volatile memories discussed above.

In step 1402 of FIG. 14, the control circuits stores data in the non-volatile memory cells by programming the non-volatile memory cells to a set of data states (see e.g., FIGS. 5A-5F). One embodiment stores data as four bits per memory cell in data states S0-S15. Other embodiments store more or less than four bits of data per memory cell. In step 1404, the control circuit reads the data stored in the non-volatile memory cells by sensing for a set of read reference levels for the data states. As discussed above, one example of read reference levels includes read reference voltages Vr1-Vr15. Other examples include read reference voltages VrA-VrG, current reference levels or other reference levels. In step 1406, the control circuit shifts one or more of the read reference levels based on sensing the non-volatile memory cells for two different conditions during a single ramping up of a voltage signal applied to the non-volatile memory cells. In one embodiment, the single ramping up of a voltage signal applied to the non-volatile memory cells is the Vread spike, but other embodiments can perform the sensing during a different ramp up of a word line voltage. The technology described herein can be used with systems that do not implement a Vread spike.

In one embodiment, the set of data states are defined by threshold voltage distributions, the set of read reference levels are read reference voltages, the two different conditions are two different threshold voltages (e.g., Vr15 and Vr15+, and the sensing for the set of read reference levels for the data states is performed by applying the read reference levels to the word lines. After shifting one or more of the read reference levels, the control circuit is configured to read data stored in the non-volatile memory cells using the shifted the one or more of the read reference levels. In some embodiments, the control circuit is further configured to shift one or more of the read reference levels differently for different data states, for example, Vr15 may be shifted different than Vr9.

Figure 15:
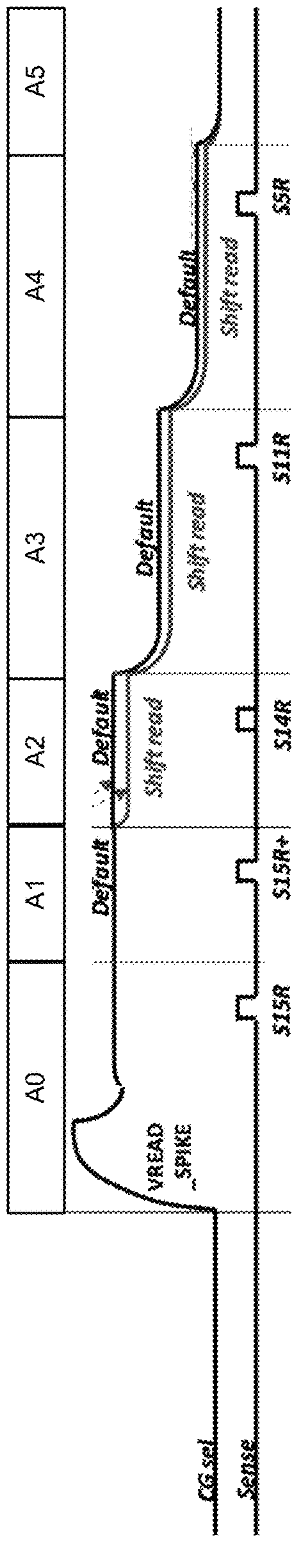
FIG. 15 is a timing diagram describing one embodiment of a process for updating read reference voltages and reading.
Figure 16:
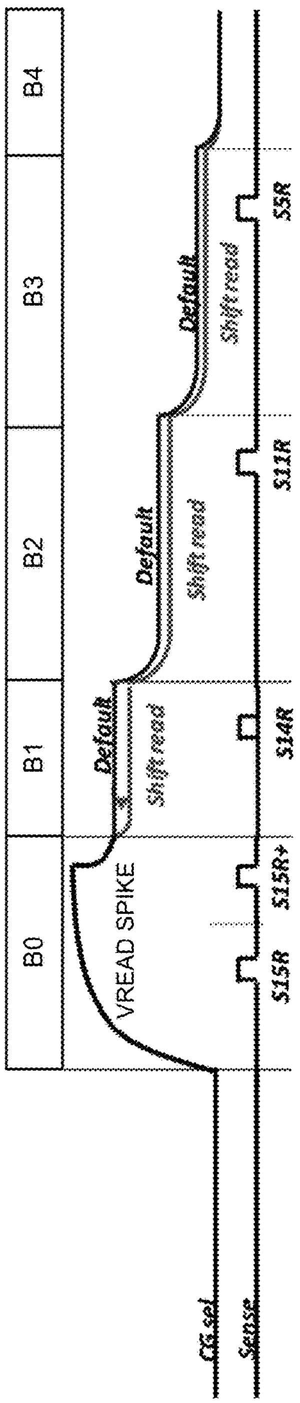
FIG. 16 is a timing diagram describing one embodiment of a process for updating read reference voltages and reading.

FIGS. 15 and 16 are timing diagrams that describe different processes for updating read reference voltages and reading. The timing diagram of FIG. 15 describes the process of FIG. 8. The timing diagram of FIG. 16 describes the process of FIG. 14. FIGS. 15 and 16 depict the behavior of two signals: CG_sel and Sense. The signal CG_sel is the voltage generated by the control circuit (e.g., by a voltage generator in the control circuit) that is applied to the word line selected for reading, such that the word line selected for reading is connected to the non-volatile memory cells selected for reading. The signal Sense is a control signal generated by the control circuit (e.g., by a voltage generator in the control circuit) that is communicated to the sense amplifiers 230 commanding the sense amplifiers to sense the selected memory cells at that moment in time.

FIG. 15 depicts time periods A0-A5. During time period A0, a Vread spike is applied to CG_sel, as per step 802 of FIG. 8. After the Vread spike, during A0, the voltage on CG_sel is at Vr15. After the voltage settles at Vr15, still during A0, a voltage pulse (S15R) is applied to Sense to cause sense amplifiers 230 to sense whether memory cells have a threshold voltage less than or equal to Vr15. During A1, a voltage pulse (S15R+) is subsequently applied to Sense to cause sense amplifiers 230 to sense whether memory cells have a threshold voltage less than or equal to Vr15+. In one embodiment, the voltage on CG_sel is raised to Vr15+ during A1. In another embodiment, the sense time is adjusted (e.g., increased) to sense for Vr15+ rather than Vr15 during A1. The sensing in response to voltage pulse (S15R) and the sensing in response to voltage pulse (S15R+) correspond to step 804 of FIG. 8. After the sensing in response to voltage pulse (S15R) and the sensing in response to voltage pulse (S15R+), the control circuit calculates the shift (e.g., lowering of voltage magnitude) to one or more of Vr1-Vr15, as discussed above with respect to FIGS. 9-13, in order to implement step 806. Step 808 of FIG. 8 includes reading a page of data, which occurs during A2, A3 and A4. During A2, CG_sel can be at Vr14 (default waveform) or at a shifted Vr14 (shifted read waveform), and a voltage pulse (S14R) is applied to Sense to cause sense amplifiers 230 to sense whether memory cells have a threshold voltage less than or equal to Vr14 or a shifted Vr14 (depending on whether the control circuit determined that Vr14 needed to be shifted). During A3, CG_sel can be at Vr11 (Default waveform) or at a shifted Vr11 (shifted read waveform), and a voltage pulse (S11R) is applied to Sense to cause sense amplifiers 230 to sense whether memory cells have a threshold voltage less than or equal to default Vr11 or a shifted Vr11 (depending on whether the control circuit determined that Vr11 needed to be shifted). During A4, CG_sel can be at Vr5 (default waveform) or at a shifted Vr5 (shifted read waveform), and a voltage pulse (S5R) is applied to Sense to cause sense amplifiers 230 to sense whether memory cells have a threshold voltage less than or equal to default Vr5 or the shifted Vr5 (depending on whether the control circuit determined that Vr11 needed to be shifted). During A5, CG_sel is lowered to ground.

FIG. 16 depicts time periods B0-B4. During time period B0, which corresponds to step 1406 of FIG. 14, a Vread spike is applied to CG_sel. During the Vread spike, while ramping up the voltage applied to CG_sel, two voltage pulses (S15R and S15R+) are applied to Sense. The first voltage pulse S15R is applied to Sense when CG_sel is at the magnitude of Vr15 to cause sense amplifiers 230 to sense whether memory cells have a threshold voltage less than or equal to Vr15. The second voltage pulse (S15R+) is applied to Sense when CG_sel is at the magnitude of Vr15+ to cause sense amplifiers 230 to sense whether memory cells have a threshold voltage less than or equal to Vr15+. Based on sensing at Vr15 and Vr15+, the control circuit determines whether to shift the read reference levels and calculates the shifts to the read reference levels. While the calculation of the shift may occur during or after the Vread spike, the two sense operations used to determine whether to shift and how much to shift are performed while ramping up the voltage on the selected word line during the Vread spike or ramping up the word line voltage for another reason (such as to read the data).

After shifting the read reference levels, the control circuit reads a page of data (or another unit of data) during time periods B1, B2 and B3. During B1, CG_sel can be at Vr14 (default waveform) or at a shifted Vr14 (shifted read waveform), and a voltage pulse (S14R) is applied to Sense to cause sense amplifiers 230 to sense whether memory cells have a threshold voltage less than or equal to Vr14 or a shifted Vr14 (depending on whether the control circuit determined that Vr14 needed to be shifted). During B2, CG_sel can be at Vr11 (default waveform) or at a shifted Vr11 (shifted read waveform), and a voltage pulse (S11R) is applied to Sense to cause sense amplifiers 230 to sense whether memory cells have a threshold voltage less than or equal to default Vr11 or a shifted Vr11 (depending on whether the control circuit determined that Vr11 needed to be shifted). During B3, CG_sel can be at Vr5 (default waveform) or at a shifted Vr5 (shifted read waveform), and a voltage pulse (S5R) is applied to Sense to cause sense amplifiers 230 to sense whether memory cells have a threshold voltage less than or equal to default Vr5 or the shifted Vr5 (depending on whether the control circuit determined that Vr11 needed to be shifted). During B4, CG_sel is lowered to ground.

Because the sensing at Vr15 and Vr15+ (see voltage pulses S15R and S15R+) is performed during the ramping up of the voltage on CG_sel, the time needed to do those two sensing operations is effectively hidden within the Vread spike; therefore, the process of FIG. 16 is completed in less time (faster) than the process of FIG. 15.

Figure 17:
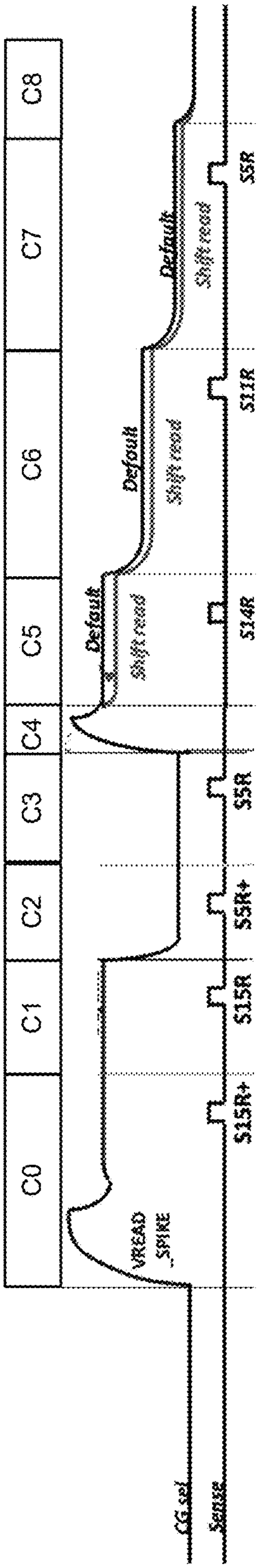
FIG. 17 is a timing diagram describing one embodiment of a process for updating read reference voltages and reading.
Figure 18:
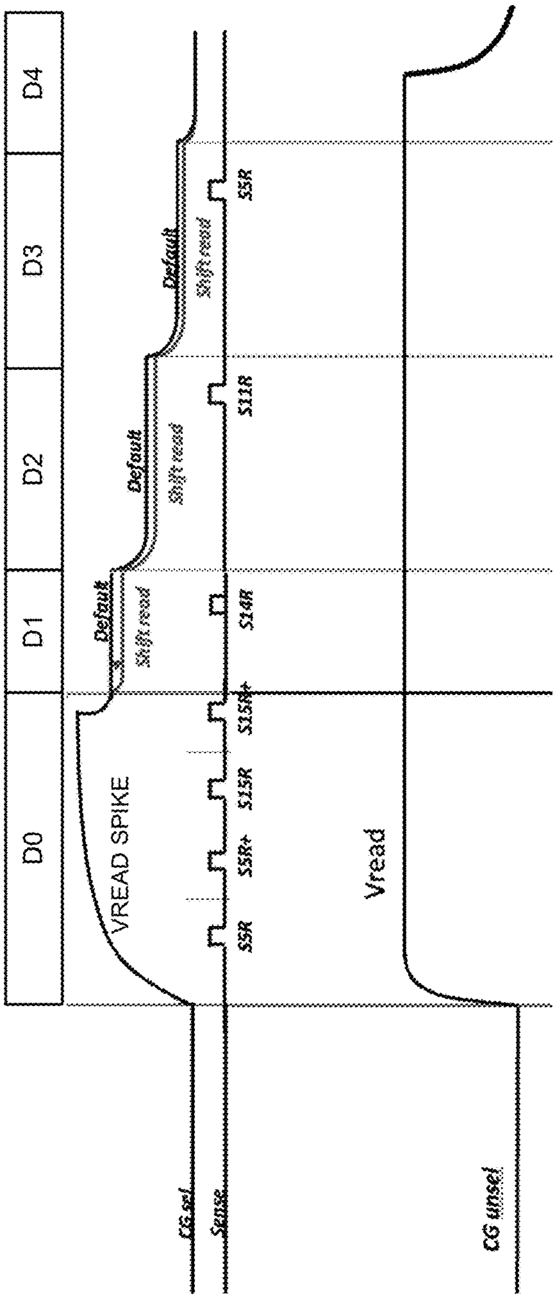
FIG. 18 is a timing diagram describing one embodiment of a process for updating read reference voltages and reading.

FIGS. 17 and 18 are timing diagrams that describe additional embodiments for updating read reference voltages and reading. The timing diagram of FIG. 17 describes another embodiment of the process of FIG. 8. The timing diagram of FIG. 18 describes another embodiment of the process of FIG. 14. FIGS. 17 and 18 depict the behavior of the signals CG_sel and Sense. FIG. 18 further shows "CG unsel," which is the voltage applied to word lines that are not selected for programming.

One difference between FIGS. 17/18 and FIGS. 15/16 is that FIGS. 17/18 include initial sensing at Vr15/Vr15+ and Vr5/Vr5+. The initial sensing at Vr15 and Vr15+ in FIGS. 17/18 is similar to the initial sensing at Vr15 and Vr15+ in FIGS. 15/16. The initial sensing at Vr5 and Vr5+ in FIGS. 17/18 is for purposes of performing temperature compensation. Shifts in threshold voltage in memory cells in data state S5 are related to differences in temperature between the temperature at time of programming and the temperature at the time of reading.

FIG. 17 depicts time periods C0-C8. During time period C0, a Vread spike is applied to CG_sel, as per step 802 of FIG. 8. After the Vread spike, during C0, the voltage on CG_sel is at Vr15+. After the voltage settles at Vr15+, still during C0, a voltage pulse (S15R+) is applied to Sense to cause sense amplifiers 230 to sense whether memory cells have a threshold voltage less than or equal to Vr15+. During C1, a voltage pulse (S15R) is applied to Sense to cause sense amplifiers 230 to sense whether memory cells have a threshold voltage less than or equal to Vr15. In one embodiment, the voltage on CG_sel is lowered to Vr15 during C1. In another embodiment, the sense time is adjusted (e.g., decreased) to sense for Vr15 rather than Vr15+ during C1. The sensing in response to voltage pulse (S15R+) and the sensing in response to voltage pulse (S15R) correspond to step 804 of FIG. 8. After the sensing in response to voltage pulse (S15R) and the sensing in response to voltage pulse (S15R+), the control circuit calculates the shift (e.g., lowering of voltage magnitude) to zero, one or more of Vr1-Vr15, as discussed above with respect to FIGS. 9-13, in order to implement step 806.

During time period C2, the voltage on CG_sel is lowered to Vr5+ (VR5+=Vr5+Δ) and a voltage pulse (S5R+) is applied to Sense to cause sense amplifiers 230 to sense whether memory cells have a threshold voltage less than or equal to Vr5+. During C3, a voltage pulse (S5R) is applied to Sense to cause sense amplifiers 230 to sense whether memory cells have a threshold voltage less than or equal to Vr5. In one embodiment, the voltage on CG_sel is lowered to Vr5 during C3. In another embodiment the sense time is adjusted (e.g., decreased) to sense for Vr5 rather than Vr5+ during C3.

Step 808 of FIG. 8 includes reading a page of data, which occurs during C4-C7. During C4, another Vread spike is applied to CG_sel. During C5, CG_sel can be at Vr14 (default waveform) or at a shifted Vr14 (shifted read waveform), and a voltage pulse (S14R) is applied to Sense to cause sense amplifiers 230 to sense whether memory cells have a threshold voltage less than or equal to Vr14 or a shifted Vr14 (depending on whether the control circuit determined that Vr14 needed to be shifted). During C6, CG_sel can be at Vr11 (default waveform) or at a shifted Vr11 (shifted read waveform), and a voltage pulse (S11R) is applied to Sense to cause sense amplifiers 230 to sense whether memory cells have a threshold voltage less than or equal to default Vr11 or a shifted Vr11 (depending on whether the control circuit determined that Vr11 needed to be shifted). During C7, CG_sel can be at Vr5 (default waveform) or at a shifted Vr5 (shifted read waveform), and a voltage pulse (S5R) is applied to Sense to cause sense amplifiers 230 to sense whether memory cells have a threshold voltage less than or equal to default Vr5 or the shifted Vr5 (depending on whether the control circuit determined that Vr11 needed to be shifted). During C8, CG_sel is lowered to ground.

FIG. 18 depicts time periods DO-D4. During time period DO, which corresponds to step 1406 of FIG. 14, a Vread spike is applied to CG_sel. That is, the voltage on CG_sel is raised from ground to Vread. During the Vread spike, while ramping up the voltage applied to CG_sel, four voltage pulses (S5R, S5R+, S15R, S15R+) are applied to Sense. The first voltage pulse S5R and the second voltage pulse S5R+ are applied to detect a change in temperature. The third voltage pulse S15R is applied to Sense when CG_sel is at the magnitude of Vr15 to cause sense amplifiers 230 to sense whether memory cells have a threshold voltage less than or equal to Vr15. The fourth voltage pulse (S15R+) is applied to Sense when CG_sel is at the magnitude of Vr15+ to cause sense amplifiers 230 to sense whether memory cells have a threshold voltage less than or equal to Vr15+. Based on sensing at Vr15 and Vr15+, the control circuit determines whether to shift and calculates the shifts to the read reference levels. While the calculation of the shift may occur during or after the Vread spike, the two sense operations used to determine whether and how much to shift are performed while ramping up the voltage on the selected word line during the Vread spike or ramping up the word line voltage for another reason (such as to read the data).

After shifting the read reference levels, the control circuit reads a page of data during time periods D1-D3. During D1, CG_sel can be at Vr14 (default waveform) or at a shifted Vr14 (shifted read waveform), and a voltage pulse (S14R) is applied to Sense to cause sense amplifiers 230 to sense whether memory cells have a threshold voltage less than or equal to Vr14 or a shifted Vr14 (depending on whether the control circuit determined that Vr14 needed to be shifted). During D2, CG_sel can be at Vr11 (default waveform) or at a shifted Vr11 (shifted read waveform), and a voltage pulse (S11R) is applied to Sense to cause sense amplifiers 230 to sense whether memory cells have a threshold voltage less than or equal to default Vr11 or a shifted Vr11 (depending on whether the control circuit determined that Vr11 needed to be shifted). During D3, CG_sel can be at Vr5 (default waveform) or at a shifted Vr5 (shifted read waveform), and a voltage pulse (S5R) is applied to Sense to cause sense amplifiers 230 to sense whether memory cells have a threshold voltage less than or equal to default Vr5 or the shifted Vr5 (depending on whether the control circuit determined that Vr11 needed to be shifted). The signal "CG unsel" is raised to Vread at that start of C0 and lowered to ground during C4. CG_sel is also lowered to ground during C4.

Because the sensing at Vr15 and Vr15+ (see voltage pulses S15R and S15R+) is performed during the ramping up of the voltage on CG_sel (e.g., during the Vread spike), the time needed to do the two sensing operations is effectively hidden within the Vread spike; therefore, the process of FIG. 18 is completed in less time (faster) than the process of FIG. 17.

Figure 19:
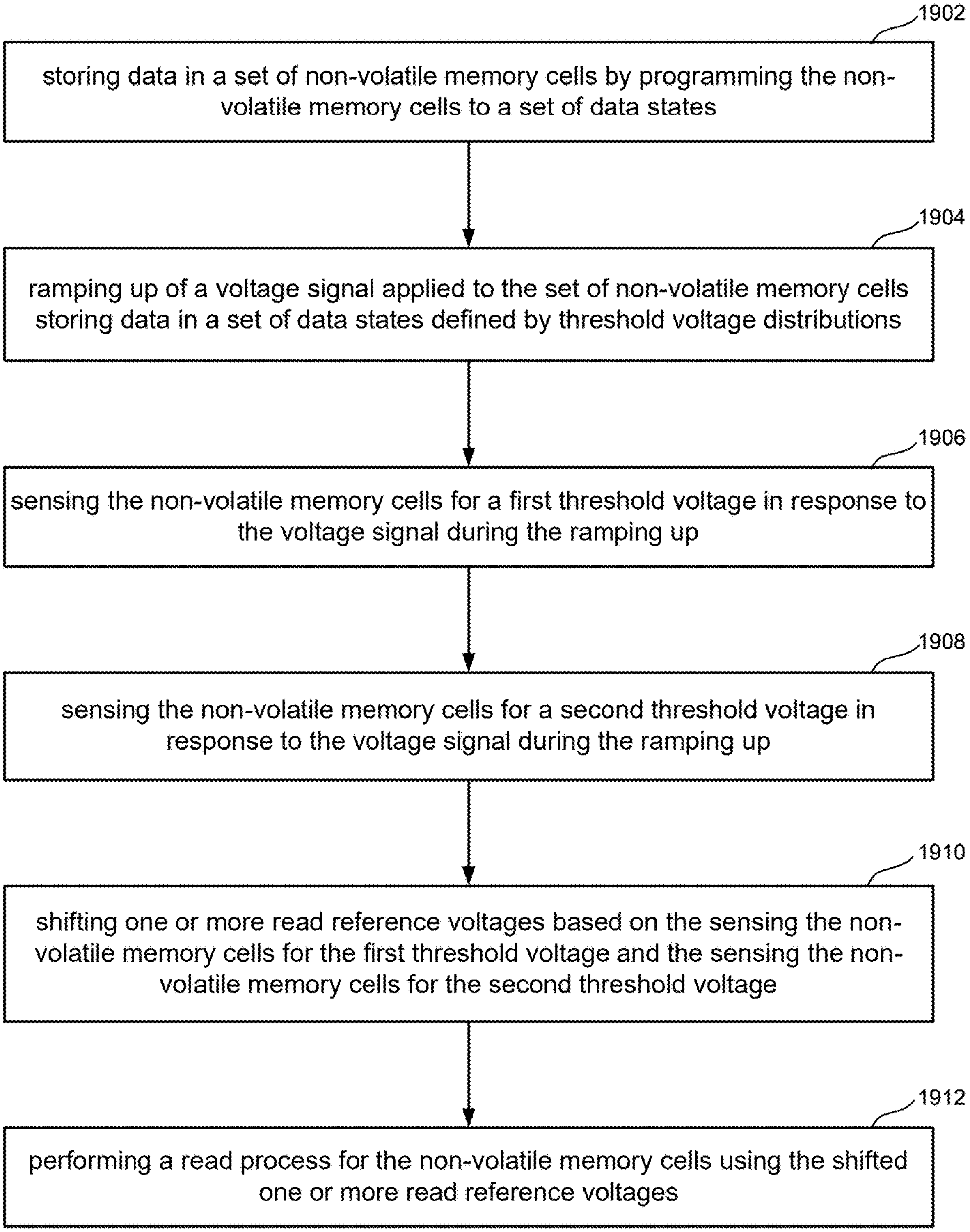
FIG. 19 is a flow chart describing one embodiment of a process for updating read reference voltages and reading.

FIG. 19 is a flow chart describing one embodiment of a process for reading that includes tracking threshold voltages and shifting the reference levels used for reading based on the tracking, such that extra sensing needed for the tracking is performed during the Vread spike rather than after the Vread spike. The process of FIG. 19 is an example implementation of the process of FIG. 14, in accordance with FIGS. 16 and/or 18. In some example implementations, the process of FIG. 19 can be performed by any one of the one or more control circuits discussed above. The process of FIG. 19 can be performed entirely by a control circuit on memory die 200 (see FIG. 2A) or entirely by a control circuit on integrated memory assembly 207 (see FIG. 2B), rather than by memory controller 120. In one example, the process of FIG. 19 is performed by or at the direction of state machine 262, using other components of System Control Logic 260, Column Control Circuitry 210 and Row Control Circuitry 220. In another embodiment, the process of FIG. 19 is performed by memory controller 120 in combination with System Control Logic 260, Column Control Circuitry 210 and Row Control Circuitry 220. In some embodiments, the process of FIG. 19 is performed on any of the non-volatile memories discussed above.

Step 1902 of FIG. 19 includes the control circuit storing data in a set of non-volatile memory cells by programming the non-volatile memory cells to a set of data states (see e.g., FIGS. 5A-F). Step 1902 correlates to step 1402.

Step 1904 includes the control circuit ramping up of a voltage signal applied to the set of non-volatile memory cells storing data in a set of data states defined by threshold voltage distributions. In one example implementation, a Vread spike is applied to a selected word lines, as depicted in FIGS. 16 and 18, so that the ramping up of a voltage signal is the ramping up of the word line voltage for the Vread spike.

Step 1906 includes the control circuit sensing the non-volatile memory cells for a first threshold voltage in response to the voltage signal during the ramping up. In one example implementation, the sensing the non-volatile memory cells for the first threshold voltage comprises applying the first threshold voltage to control gates of the non-volatile memory cells and determining whether the non-volatile memory cells turn on. An example of step 1908 includes sensing at Vr15 during time period B0 of FIG. 16 or during time period DO of FIG. 18.

Step 1908 includes the control circuit sensing the non-volatile memory cells for a second threshold voltage in response to the voltage signal during the ramping up. In one example implementation, the sensing the non-volatile memory cells for the second threshold voltage comprises applying the second threshold voltage to control gates of the non-volatile memory cells and determining whether the non-volatile memory cells turn on. An example of step 1908 includes sensing at Vr15+ during time period B0 of FIG. 16 or during time period DO of FIG. 18.

Step 1910 includes the control circuit shifting one or more read reference voltages based on the sensing the non-volatile memory cells for the first threshold voltage and the sensing the non-volatile memory cells for the second threshold voltage. In one embodiment, the shifting is performed as discussed above with respect to FIGS. 11-13. Steps 1904-1910 correlate to step 1406.

Step 1912 includes the control circuit performing a read process for the non-volatile memory cells using the shifted one or more read reference voltages.

Figure 20:
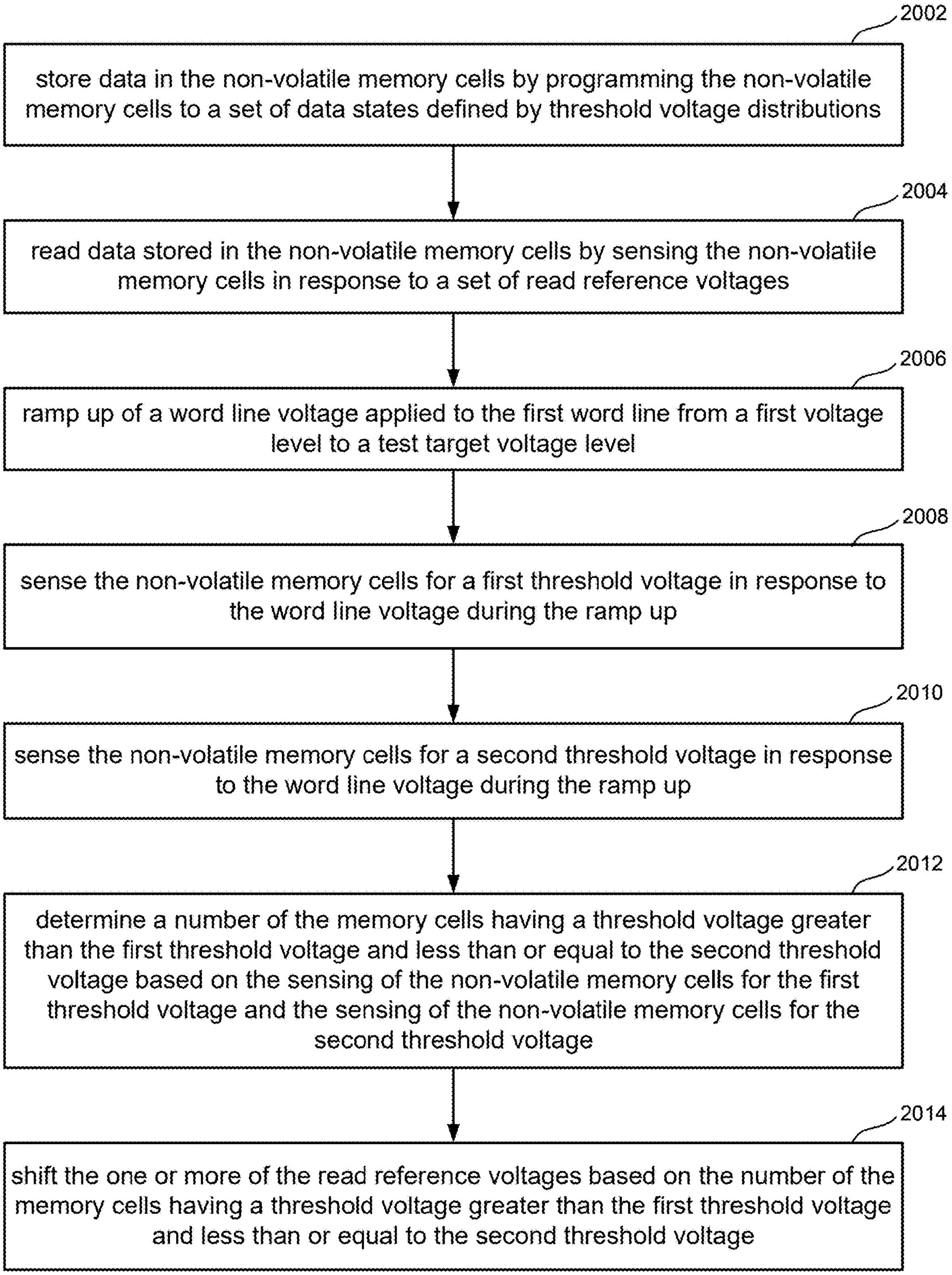
FIG. 20 is a flow chart describing one embodiment of a process for updating read reference voltages and reading.

FIG. 20 is a flow chart describing one embodiment of a process for reading that includes tracking threshold voltages and shifting the reference levels used for reading based on the tracking, such that extra sensing needed for the tracking is performed during the Vread spike rather than after the Vread spike. The process of FIG. 20 is an example implementation of the processes of FIGS. 14 and/or 19, in accordance with FIGS. 16 and/or 18. In some example implementations, the process of FIG. 20 can be performed by any one of the one or more control circuits discussed above. The process of FIG. 20 can be performed entirely by a control circuit on memory die 200 (see FIG. 2A) or entirely by a control circuit on integrated memory assembly 207 (see FIG. 2B), rather than by memory controller 120. In one example, the process of FIG. 20 is performed by or at the direction of state machine 262, using other components of System Control Logic 260, Column Control Circuitry 210 and Row Control Circuitry 220. In another embodiment, the process of FIG. 20 is performed by memory controller 120 in combination with System Control Logic 260, Column Control Circuitry 210 and Row Control Circuitry 220. In some embodiments, the process of FIG. 20 is performed on any of the non-volatile memories discussed above.

In step 2002 of FIG. 20, the control circuit stores data in the non-volatile memory cells by programming the non-volatile memory cells to a set of data states defined by threshold voltage distributions. Step 2002 correlates to step 1402. The non-volatile memory cells are connected to a first word line.

In step 2004, the control circuit reads data stored in the non-volatile memory cells by sensing the non-volatile memory cells in response to a set of read reference voltages. Step 2004 correlates to step 1404.

In step 2006, the control circuit ramps up of a word line voltage applied to the first word line from a first voltage level to a test target voltage level. In one example implementation, a Vread spike is applied to a selected word line, as depicted in FIGS. 16 and 18, so that the ramping up of a word line voltage is the ramping up of the word line voltage for the Vread spike.

In step 2008, the control circuit senses the non-volatile memory cells for a first threshold voltage in response to the word line voltage during the ramp up of the word line voltage. In one example implementation, the sensing the non-volatile memory cells for the first threshold voltage comprises applying the first threshold voltage to control gates of the non-volatile memory cells and determining whether the non-volatile memory cells turn on. An example of step 2008 includes sensing at Vr15 during time period B0 of FIG. 16 or during time period D0 of FIG. 18.

In step 2010, the control circuit senses the non-volatile memory cells for a second threshold voltage in response to the word line voltage during the ramp up of the word liner voltage. In one example implementation, the sensing the non-volatile memory cells for the second threshold voltage comprises applying the second threshold voltage to control gates of the non-volatile memory cells and determining whether the non-volatile memory cells turn on. An example of step 2010 includes sensing at Vr15+ during time period B0 of FIG. 16 or during time period DO of FIG. 18.

In step 2012, the control circuit determines a number of the memory cells having a threshold voltage greater than the first threshold voltage and less than or equal to the second threshold voltage based on the sensing of the non-volatile memory cells for the first threshold voltage and the sensing of the non-volatile memory cells for the second threshold voltage.

In step 2014, the control circuit shifts the one or more of the read reference voltages based on the number of the memory cells having a threshold voltage greater than the first threshold voltage and less than or equal to the second threshold voltage. Steps 2006-2014 correlate to step 1406. In one example implementation, the control circuit is configured to read data stored in the non-volatile memory cells by applying the read reference voltages to the first word line while applying an overdrive voltage (e.g., Vread) to the other word line, the test target level is the overdrive voltage, the control circuit is configured to read data stored in the non-volatile memory cells after the shifting of the one or more of the read reference voltages by lowering the word line voltage applied to the first word line from the overdrive voltage to one of the read reference voltages.

A non-volatile memory has been disclosed that, to compensate for data retention issues, updates read reference levels for more accurately reading data stored in the memory.

In one embodiment, a non-volatile storage apparatus stores data in the non-volatile memory cells by programming the non-volatile memory cells to a set of data states and reads data stored in the non-volatile memory cells by sensing for a set of read reference levels for the data states. To address data retention issues, including memory cells having the threshold voltages drift over time, one or more of the set of read reference levels are shifted based on sensing the non-volatile memory cells for two different conditions during a single ramping up of a voltage signal applied to the non-volatile memory cells.

One embodiment includes a non-volatile storage apparatus, comprising non-volatile memory cells and a control circuit connected to the non-volatile memory cells. The control circuit is configured to store data in the non-volatile memory cells by programming the non-volatile memory cells to a set of data states. The control circuit is configured to read data stored in the non-volatile memory cells by sensing for a set of read reference levels for the data states. The control circuit is further configured to shift one or more of the read reference levels based on sensing the non-volatile memory cells for two different conditions during a single ramping up of a voltage signal applied to the non-volatile memory cells.

In one example implementation, the set of data states are defined by threshold voltage distributions; the set of read reference levels are read reference voltages; and the two different conditions are two different threshold voltages.

In one example implementation, the control circuit is further configured to shift one or more of the read reference levels by: ramping up of the voltage signal applied to the non-volatile memory cells; sensing the non-volatile memory cells for a first threshold voltage in response to the voltage signal during the ramping up; sensing the non-volatile memory cells for a second threshold voltage in response to the voltage signal during the ramping up; and shifting one or more of the read reference voltages based on the sensing the non-volatile memory cells for the first threshold voltage and the sensing the non-volatile memory cells for the second threshold voltage.

One example implementation further comprises a word line connected to the non-volatile memory cells and the control circuit, the control circuit is configured to apply the voltage signal to the non-volatile memory cells via the word line.

In one example implementation, the control circuit is configured to sense for the set of read reference levels for the data states by applying the read reference levels to the word lines.

In one example implementation, the control circuit is configured to perform the single ramping up of the voltage signal by ramping up the voltage signal on the word line from a first voltage level to an overdrive voltage; and the control circuit is configured to read data from the non-volatile memory cells by lowering the voltage signal on the word line from the overdrive voltage to one of the read reference voltages and applying the overdrive voltage to the other word lines connected to other memory cells.

One example implementation further comprises a word line connected to the non-volatile memory cells and the control circuit. Wherein the control circuit is further configured to shift one or more of the read reference levels by: ramping up of the voltage signal one the first word line from a first voltage level to a test target voltage level, sensing the non-volatile memory cells for a first threshold voltage in response to the word line voltage during the ramp up, sensing the non-volatile memory cells for a second threshold voltage in response to the word line voltage during the ramp up, determining a number of the memory cells having a threshold voltage greater than the first threshold voltage and less than or equal to the second threshold voltage based on the sensing of the non-volatile memory cells for the first threshold voltage and the sensing of the non-volatile memory cells for the second threshold voltage, and shifting the one or more of the read reference voltages based on the number of the memory cells having a threshold voltage greater than the first threshold voltage and less than or equal to the second threshold voltage.

One example implementation further comprises other memory cells and other word lines connected to the other memory cells; the control circuit is configured to read data stored in the non-volatile memory cells by applying the read reference voltages to the first word line while applying an overdrive voltage to the other word line; the test target level is the overdrive voltage; and the control circuit is configured to read data stored in the non-volatile memory cells after the shifting of the one or more of the read reference voltages by lowering the word line voltage applied to the first word line from the overdrive voltage to one of the read reference voltages.

In one example implementation, after the shift of the one or more of the read reference levels, the control circuit is configured to read data stored in the non-volatile memory cells using the shifted the one or more of the read reference levels.

In one example implementation, the control circuit is further configured to shift one or more of the read reference levels differently for different data states.

In one example implementation, the control circuit is further configured to shift one or more of the read reference levels by lowering the one or more read reference levels.

One example implementation further comprises a plurality of word lines connected to the non-volatile memory cells, the non-volatile memory cells are arranged in NAND strings; and a plurality of bit lines connected to the NAND strings; the NAND strings, bit lines and word lines together form a three dimensional memory array;

One embodiment includes a method comprising: ramping up of a voltage signal applied to a set of non-volatile memory cells storing data in a set of data states defined by threshold voltage distributions; sensing the non-volatile memory cells for a first threshold voltage in response to the voltage signal during the ramping up; sensing the non-volatile memory cells for a second threshold voltage in response to the voltage signal during the ramping up; shifting one or more read reference voltages based on the sensing the non-volatile memory cells for the first threshold voltage and the sensing the non-volatile memory cells for the second threshold voltage; and performing a read process for the non-volatile memory cells using the shifted one or more read reference voltages.

In one example implementation, the set of non-volatile memory cells are connected to a first word line; the voltage signal applied to the set of non-volatile memory cells is applied via the first word line; the ramping up the voltage signal comprises ramping up the voltage signal on the first word line from a first voltage level to an overdrive voltage; and the performing the read process comprises lowering the voltage signal on the first word line from the overdrive voltage to one of the read reference voltages and applying the overdrive voltage to the other word lines connected to other memory cells.

In one example implementation, the sensing the non-volatile memory cells for the first threshold voltage comprises applying the first threshold voltage to control gates of the non-volatile memory cells and determining whether the non-volatile memory cells turn on; the sensing the non-volatile memory cells for the second threshold voltage comprises applying the second threshold voltage to control gates of the non-volatile memory cells and determining whether the non-volatile memory cells turn on; the second threshold voltage is greater in voltage magnitude than the first threshold voltage; and the shifting comprises: determining a number of the memory cells having a threshold voltage greater than the first threshold voltage and less than or equal to the second threshold voltage based on the sensing of the non-volatile memory cells for the first threshold voltage and the sensing of the non-volatile memory cells for the second threshold voltage, and shifting the one or more of the read reference voltages based on the number of the memory cells having a threshold voltage greater than the first threshold voltage and less than or equal to the second threshold voltage.

In one example implementation, the shifting one or more read reference voltages comprises lowering the read reference voltages based on the sensing the non-volatile memory cells for the first threshold voltage and the sensing the non-volatile memory cells for the second threshold voltage.

In one example implementation, the shifting comprises shifting the one or more of the read reference voltages differently for different data states.

One embodiment includes a non-volatile storage apparatus, comprising: non-volatile memory cells; a first word line connected to the non-volatile memory cells; and a control circuit connected to the non-volatile memory cells and the first word line. The control circuit is configured to store data in the non-volatile memory cells by programming the non-volatile memory cells to a set of data states defined by threshold voltage distributions. The control circuit is configured to read data stored in the non-volatile memory cells by sensing the non-volatile memory cells in response to a set of read reference voltages. The control circuit is further configured to: ramp up of a word line voltage applied to the first word line from a first voltage level to a test target voltage level, sense the non-volatile memory cells for a first threshold voltage in response to the word line voltage during the ramp up, sense the non-volatile memory cells for a second threshold voltage in response to the word line voltage during the ramp up, determine a number of the memory cells having a threshold voltage greater than the first threshold voltage and less than or equal to the second threshold voltage based on the sensing of the non-volatile memory cells for the first threshold voltage and the sensing of the non-volatile memory cells for the second threshold voltage, and shift the one or more of the read reference voltages based on the number of the memory cells having a threshold voltage greater than the first threshold voltage and less than or equal to the second threshold voltage.

One example implementation further comprises other memory cells and other word lines connected to the other memory cells, the control circuit is configured to read data stored in the non-volatile memory cells by applying the read reference voltages to the first word line while applying an overdrive voltage to the other word line, the test target level is the overdrive voltage, the control circuit is configured to read data stored in the non-volatile memory cells after the shifting of the one or more of the read reference voltages by lowering the word line voltage applied to the first word line from the overdrive voltage to one of the read reference voltages.

In one example implementation, the control circuit is further configured to shift the one or more of the read reference voltages differently for different data states.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:

non-volatile memory cells; and a control circuit connected to the non-volatile memory cells, the control circuit is configured to store data in the non-volatile memory cells by programming the non-volatile memory cells to a set of data states, the control circuit is configured to read data stored in the non-volatile memory cells during a read process by sensing the non-volatile memory cells in response to a set of one or more read reference levels for the data states in order to determine which data state each of the non-volatile memory cells are in, the control circuit is further configured to shift one or more of the read reference levels based on sensing the non-volatile memory cells for two different conditions during a single ramping up to an overdrive voltage of a voltage signal applied to the non-volatile memory cells prior to applying the read reference levels during the read process.

2. The non-volatile storage apparatus of claim 1, wherein:

the set of data states are defined by threshold voltage distributions;

the set of read reference levels are read reference voltages; and the two different conditions are two different threshold voltages.

3. The non-volatile storage apparatus of claim 2, wherein the control circuit is further configured to shift one or more of the read reference levels by:

ramping up of the voltage signal applied to the non-volatile memory cells to the overdrive voltage;

sensing the non-volatile memory cells for a first threshold voltage in response to the voltage signal during the ramping up to the overdrive voltage;

sensing the non-volatile memory cells for a second threshold voltage in response to the voltage signal during the ramping up to the overdrive voltage;

determining a number of the non-volatile memory cells having a threshold voltage greater than the first threshold voltage and less than or equal to the second threshold voltage based on the sensing of the non-volatile memory cells for the first threshold voltage and the sensing of the non-volatile memory cells for the second threshold voltage, shifting one or more of the read reference voltages based on the determined number of the non-volatile memory cells having a threshold voltage greater than the first threshold voltage and less than or equal to the second threshold voltage.

4. The non-volatile storage apparatus of claim 3, further comprising:

a word line connected to the non-volatile memory cells and the control circuit, the control circuit is configured to apply the voltage signal to the non-volatile memory cells via the word line.

5. The non-volatile storage apparatus of claim 1, wherein:

the control circuit is further configured to shift one or more of the read reference levels that are different than the two different conditions.

6. The non-volatile storage apparatus of claim 4, wherein:

the control circuit is configured to read data from the non-volatile memory cells by lowering the voltage signal on the word line from the overdrive voltage to one of the read reference voltages and applying the overdrive voltage to the other word lines connected to other memory cells.

7. The non-volatile storage apparatus of claim 2, further comprising:

a first word line connected to the non-volatile memory cells and the control circuit, the control circuit is configured to read data stored in the non-volatile memory cells by applying the one or more read reference levels to the first word line and sensing the non-volatile memory cells in response to applying the one or more read reference levels to the first word line, wherein the control circuit is further configured to shift one or more of the read reference levels by:

ramping up of the voltage signal one the first word line to the overdrive voltage, sensing the non-volatile memory cells for a first threshold voltage while ramping up the voltage signal on the first word line to the overdrive voltage, sensing the non-volatile memory cells for a second threshold voltage while ramping up the voltage signal on the first word line to the overdrive voltage, determining a number of the memory cells having a threshold voltage greater than the first threshold voltage and less than or equal to the second threshold voltage based on the sensing of the non-volatile memory cells for the first threshold voltage and the sensing of the non-volatile memory cells for the second threshold voltage, and shifting the one or more of the read reference voltages based on the number of the memory cells having a threshold voltage greater than the first threshold voltage and less than or equal to the second threshold voltage.

8. The non-volatile storage apparatus of claim 7, further comprising:

other memory cells and other word lines connected to the other memory cells, the control circuit is configured to read data stored in the non-volatile memory cells by applying the read reference voltages to the first word line while applying the overdrive voltage to the other word line, the control circuit is configured to read data stored in the non-volatile memory cells after the shifting of the one or more of the read reference voltages by lowering the word line voltage applied to the first word line from the overdrive voltage to one of the read reference voltages.

9. The non-volatile storage apparatus of claim 1, wherein:

after the shift of the one or more of the read reference levels, the control circuit is configured to read data stored in the non-volatile memory cells using the shifted the one or more of the read reference levels.

10. The non-volatile storage apparatus of claim 1, wherein:

the control circuit is further configured to shift one or more of the read reference levels differently for different data states.

11. The non-volatile storage apparatus of claim 1, wherein:

the control circuit is further configured to shift one or more of the read reference levels by lowering the one or more read reference levels.

12. The non-volatile storage apparatus of claim 1, further comprising:

a plurality of word lines connected to the non-volatile memory cells, the non-volatile memory cells are arranged in NAND strings; and a plurality of bit lines connected to the NAND strings;

the NAND strings, bit lines and word lines together form a three dimensional memory array.

13. A method, comprising:

applying a voltage signal to a set of non-volatile memory cells storing data in a set of data states defined by threshold voltage distributions including ramping up the voltage signal to an overdrive voltage and then eventually lowering the voltage signal to one or more read reference voltages of a set of read reference voltages;

sensing the non-volatile memory cells for a first threshold voltage in response to the voltage signal during the ramping up of the voltage signal to the overdrive voltage;

sensing the non-volatile memory cells for a second threshold voltage in response to the voltage signal during the ramping up of the voltage signal to the overdrive voltage;

shifting one or more read reference voltages based on the sensing the non-volatile memory cells for the first threshold voltage and the sensing the non-volatile memory cells for the second threshold voltage; and performing a read process for the non-volatile memory cells using the shifted one or more read reference voltages by sensing the non-volatile memory cells in response to applying the shifted one or more read reference voltages as part of the voltage signal to determine which data state of the set of data states the non-volatile memory cells are storing data in.

14. The method of claim 13, wherein:

the set of non-volatile memory cells are connected to a first word line;

the voltage signal applied to the set of non-volatile memory cells is applied via the first word line; and the performing the read process comprises lowering the voltage signal on the first word line from the overdrive voltage to one of the read reference voltages and applying the overdrive voltage to the other word lines connected to other memory cells.

15. The method of claim 13, wherein:

the sensing the non-volatile memory cells for the first threshold voltage comprises applying the first threshold voltage to control gates of the non-volatile memory cells and determining whether the non-volatile memory cells turn on;

the sensing the non-volatile memory cells for the second threshold voltage comprises applying the second threshold voltage to control gates of the non-volatile memory cells and determining whether the non-volatile memory cells turn on;

the second threshold voltage is greater in voltage magnitude than the first threshold voltage; and the shifting comprises:

determining a number of the memory cells having a threshold voltage greater than the first threshold voltage and less than or equal to the second threshold voltage based on the sensing of the non-volatile memory cells for the first threshold voltage and the sensing of the non-volatile memory cells for the second threshold voltage, and shifting the one or more of the read reference voltages based on the number of the memory cells having a threshold voltage greater than the first threshold voltage and less than or equal to the second threshold voltage.

16. The method of claim 13, wherein:

the shifting one or more read reference voltages comprises lowering the read reference voltages based on the sensing the non-volatile memory cells for the first threshold voltage and the sensing the non-volatile memory cells for the second threshold voltage.

17. The method of claim 13, wherein:

the shifting comprises shifting the one or more of the read reference voltages differently for different data states.

18. A non-volatile storage apparatus, comprising:

selected non-volatile memory cells;

unselected non-volatile memory cells;

a first word line connected to the selected non-volatile memory cells;

additional word lines connected to the unselected non-volatile memory cells; and a control circuit connected to the selected non-volatile memory cells, the unselected non-volatile memory cells, the additional word lines and the first word line, the control circuit is configured to store data in the selected non-volatile memory cells by programming the selected non-volatile memory cells to a set of data states defined by threshold voltage distributions, the control circuit is configured to read data stored in the selected non-volatile memory cells by sensing the selected non-volatile memory cells in response to a set of read reference voltages while applying an overdrive voltage to the unselected non-volatile memory cells via the additional word lines, the control circuit is further configured to:

ramp up of a word line voltage applied to the first word line to the overdrive voltage, sense the selected non-volatile memory cells for a first threshold voltage while ramping up the word line voltage applied to the first word line to the overdrive voltage, sense the selected non-volatile memory cells for a second threshold voltage while ramping up the word line voltage applied to the first word line to the overdrive voltage, determine a number of the selected memory cells having a threshold voltage greater than the first threshold voltage and less than or equal to the second threshold voltage based on the sensing of the selected non-volatile memory cells for the first threshold voltage and the sensing of the selected non-volatile memory cells for the second threshold voltage, shift the one or more of the read reference voltages based on the number of the selected memory cells having a threshold voltage greater than the first threshold voltage and less than or equal to the second threshold voltage, and sense the selected non-volatile memory cells in response to the shifted read reference voltages while applying the overdrive voltage to the unselected non-volatile memory cells via the additional word lines.

19. The non-volatile storage apparatus of claim 18, wherein:

the control circuit is configured to sense the selected non-volatile memory cells in response to the shifted reference voltages after lowering the word line voltage applied to the first word line from the overdrive voltage to one of the shifted read reference voltages.

20. The non-volatile storage apparatus of claim 19, wherein:

the control circuit is further configured to shift the one or more of the read reference voltages differently for different data states.

* * * * *